United States Patent
Milbert et al.

(10) Patent No.: US 9,203,365 B1
(45) Date of Patent: Dec. 1, 2015

(54) LIGHTWEIGHT AMPLIFIER

(76) Inventors: Michael B. Milbert, Darnestown, MD (US); Alfred N. Milbert, Darnestown, MD (US)

(*) Notice: Subject to any disclaimer, the term of this patent is extended or adjusted under 35 U.S.C. 154(b) by 584 days.

(21) Appl. No.: 13/552,415

(22) Filed: Jul. 18, 2012

Related U.S. Application Data

(60) Provisional application No. 61/508,752, filed on Jul. 18, 2011.

(51) Int. Cl.
*H03F 5/00* (2006.01)

(52) U.S. Cl.
CPC .................................... *H03F 5/00* (2006.01)

(58) Field of Classification Search
CPC ........................... H03F 5/00; H03F 21/00
USPC ................... 330/3, 4.6, 4.7, 5, 41–44
See application file for complete search history.

(56) References Cited

U.S. PATENT DOCUMENTS

| | | | |
|---|---|---|---|
| 1,214,802 A | 2/1917 | Low | |
| 2,155,947 A | 4/1939 | Low | |
| 2,710,312 A | 6/1955 | Hafler | |
| 5,127,059 A * | 6/1992 | Elion et al. | 381/120 |
| 5,604,461 A * | 2/1997 | Rozenblit | 330/81 |
| 5,612,646 A | 3/1997 | Berning | |
| 5,859,565 A * | 1/1999 | Reiffin | 330/71 |
| 6,265,938 B1 * | 7/2001 | Reiffin | 330/71 |
| 7,397,303 B2 * | 7/2008 | Mieda | 330/127 |
| 7,511,571 B2 * | 3/2009 | Frankland et al. | 330/71 |
| 7,583,141 B1 * | 9/2009 | Chung | 330/193 |
| 7,820,904 B1 | 10/2010 | Robling | |
| 7,824,940 B2 | 11/2010 | Chae | |

FOREIGN PATENT DOCUMENTS

| | | |
|---|---|---|
| DE | 29614152 | 10/1996 |
| EP | 1172328 | 1/2002 |
| GB | 2062592 | 5/1981 |

* cited by examiner

*Primary Examiner* — Henry Choe
(74) *Attorney, Agent, or Firm* — James Creighton Wray

(57) ABSTRACT

Audio input tubes and power output tubes in a vacuum tube amplifier are powered and controlled by solid state controllers. The solid state controllers sample incoming audio and anticipate and apply changes and biases in grid and plate voltages before the audio signals arrive in the power output tubes. Any mains voltage is filtered, regulated and converted to a standard voltage which is converted to plural DC voltages that are applied to sensors, tube cathode heaters, grids and plates and are varied on screen grids and plates with stepped increases and autobias. The solid state components have sensors and feedback to control voltages. Sensed overvoltages fold back power to the solid state devices and heaters, screens and plates to provide uninterrupted amplification without endangering the tubes or components.

24 Claims, 19 Drawing Sheets

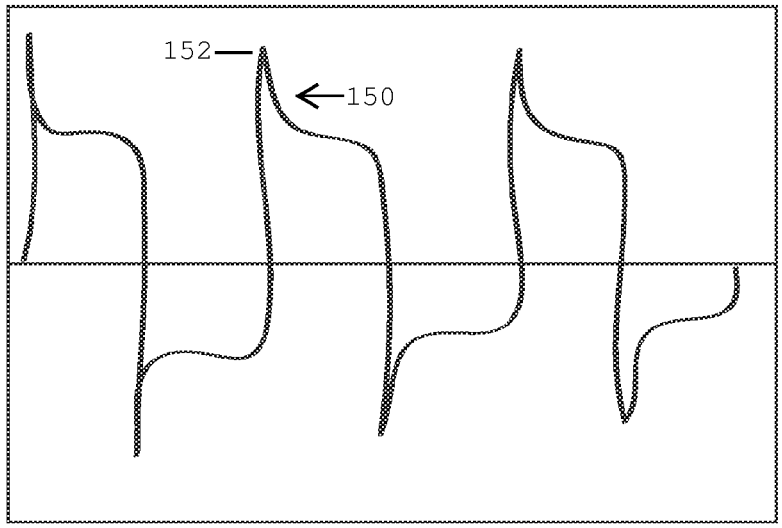

Typical SMPS switching waveform, showing hard-edge, leading "spikes" which denote ultra high frequency signal content, manifesting as unwanted noise in high-gain systems.

Fig.2A

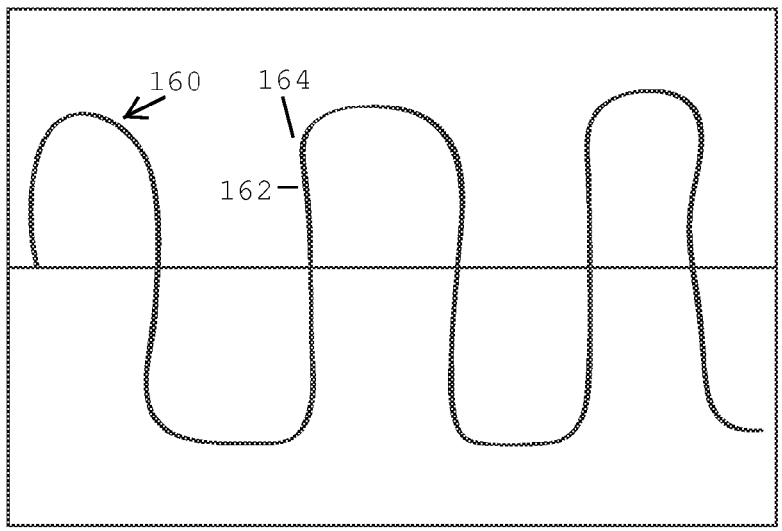

SMPS switching waveform, showing leading edge of unwanted high-frequency noise "softened". This denotes a trade-off of unwanted noise versus unwanted heat generated in the power switching devices.

Fig.2B

Feed "brain" so it can pre-boost in expectation of coming signal peaks, or auto-reduce during quieter / idle passages or periods.

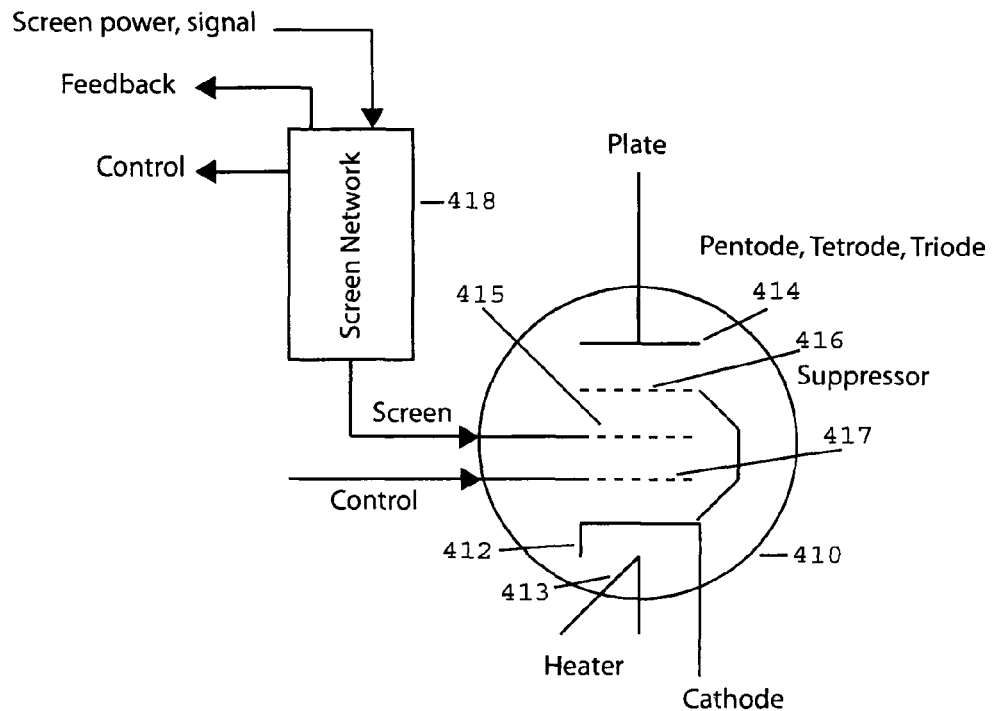
Fig. 13
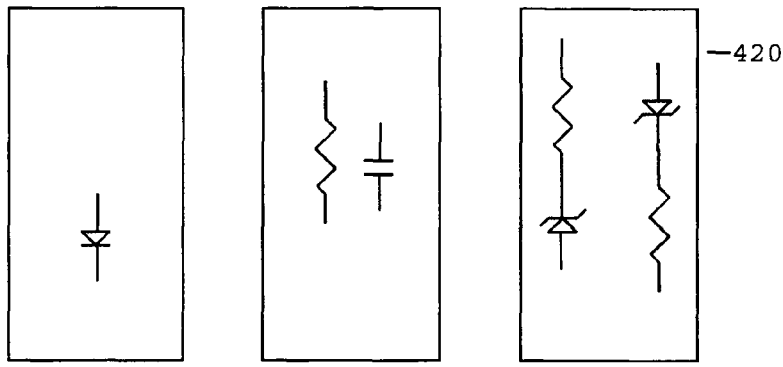
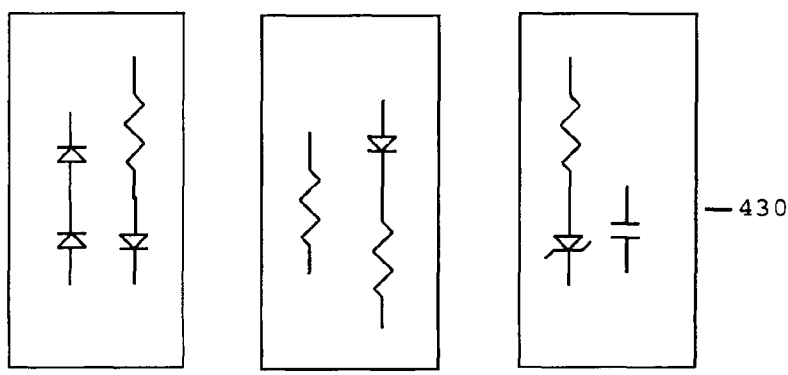
Fig. 14

Power supplies, converters may be internally or externally synchronized to a clock source.
Clock source optionally may be picked out from noise on audio signal.

Switching frequencies (via multipliers, PLLs) may be related serially, parallel, triggered, stepped, or otherwise wombined to reduce noise.

Autobias circuit may adjust the common cathode current
to control overall operating point, and it may also adjust
the differential inputs to control "push" and/or "pull"
operating points.

Extends P3 patent. Offers post-energy-storage circuit breaker to protect sensitive pickups, pedals, electronics from high-energy discharge upon fault.

LIGHTWEIGHT AMPLIFIER

This application claims the benefit of U.S. Provisional Application No. 61/508,752, filed Jul. 18, 2011, which are hereby incorporated by reference in their entirety as if fully set forth herein.

BACKGROUND OF THE INVENTION

The "golden era" of vacuum tube power amplification for guitar, bass and musical instruments may be considered as beginning generally when Mr. Leo Fender developed amplifiers which were essentially copied from early designs offered by RCA and other vacuum tube manufacturers in "app notes" or example designs meant to encourage adoption and application of vacuum tubes. Subsequent designs have mostly been copies of those copies. The result has minimized innovation.

Needs exist for improved audio and musical instrument amplifiers.

SUMMARY OF THE INVENTION

A collection and interconnection of technologies is disclosed which, when combined together, form a new kind of audio and musical instrument amplifier. The new amplifier (TNA) significantly advances the art with subjectively and measurably improved performance. In addition to the audible improvements and the new features are dramatic reductions in weight and boosts in efficiency.

TNA introduces innovations at many levels, from the advanced power supply switching and control techniques, to the filtering, layout, magnetics applications, protective circuitry, and incorporation of advanced power tube circuitry ("ZOTL"), preamplifier tube circuitry, tone shaping circuitry, and mechanisms of exaggerating or even generating desirable distortions and control thereof.

Use of a new impedance converter optimally matches output tubes to speakers and enables TNA to maximally convey the warm, pure tone and feel of vacuum tubes, whether "clean" or highly distorted on purpose. Magnetic hysteresis affecting all frequencies, magnetic core saturations affecting the bass, and electrostatic parasitics affecting the high frequencies are all eliminated. One desirable result is audio amplification using vacuum tubes with unprecedented performance in high-fidelity, purposely distorting amplification and all combinations thereof.

TNA accepts universal mains power. The elimination of all bulky magnetics cuts the weight of TNA dramatically. Any common audio output tubes may be used in any combination for desired tonal characteristics. A Power-Step control allows output volume to be reduced while maintaining full output tube distortion and character. TNA may include the patented P3 Phantom Power described in U.S. Pat. No. 7,824,940.

TNA introduces innovations at many levels, from the advanced power supply switching and control techniques, to the filtering, layout, magnetics applications, protective circuitry, and incorporation of advanced power tube circuitry ("ZOTL"), preamplifier tube circuitry, tone shaping circuitry, and mechanisms of exaggerating or even generating desirable distortions and control thereof.

The new lightweight packable amplifier weighs 12 pounds and produces outputs of 50 watts. The new kind of tube amplifier is pinky-weight, and all-tube, and produces cleaner cleans, dirtier dirties. TNA transcends limitations and maximizes musical ecstasy.

The new kind of tube amplifier obviates the traditional audio output transformer by a new impedance converter that optimally matches output tubes to speakers and enables the new amplifier to maximally convey the warm, pure tone and feel of vacuum tubes. Hysteresis affecting all frequencies, saturations affecting the bass, and parasitics affecting the highs are all eliminated, unleashing emotive amplification that is audible, measurable, and emotionally involving.

While the audio circuits are all tubes for finesse in sound, the support circuits that control voltages in the plates, grids and cathodes of the tubes and that control current in the plate heaters are all digital for compactness and lightness and fast millisecond responses. The solid state controls are so fast that sensing audio input upon receipt allows modifying of plate, grid and cathode voltages by the time that the audio signal reaches the output stage.

The digital operation allows the P3 system connected to power the pedals to over supply or under supply the usually required 9V DC power within ranges of pedal limits. P3 U.S. Pat. No. 7,820,904 is incorporated by reference as if fully set forth herein.

The sounds of the new amplifier are no longer coupled to transformers.

Supersonically powered, the new amplifier is robust, flexible and World Power Ready™. The elimination of all bulky magnetics cuts the weight of the new amplifier dramatically. Any common audio output tubes may be plugged in and played immediately, in any combination for desired tonality. A Power-Step™ control allows output volume to be reduced while maintaining full output tube distortion and character. Previously patented P3™ Pedal Power allows the new amplifier to remotely power effects pedals and active pickups through standard cabling. The new amplifier faithfully brings musicians closer to their true tone and musical ecstasy.

The invention involves adding a new kind of ultra linear operation to the Power-Step circuitry.

The ultra linear operation involves a primary-side tapped audio transformer delivering a percentage of primary audio waveform that appears across the plate and cathode to the screen control grid. In this way the screen voltage and electrostatic field is also modulated and does not present a set voltage field. The result is a more linear operation as the screen scales in voltage and mirrors the plate, maintaining its overall percentage difference related to the plate.

The new Power-Step circuitry provides an ultra linear voltage instead of or in addition to a steady voltage used in the new Power-Step. An advantage is that no audio output transformer involved.

The Power-Step circuitry provides a modified ultra linear voltage. In this case, the Power-Step injects a related or even totally different kind of signal, including for example, a harmonic and/or an extremely distorted version of the input signal, and the output tubes mix in the distorted Power-Step signal in addition to the linear or nonlinear operation.

The ultra linear Power-Step and the distortable Power-Step signals offer totally new kinds of distortion in tube guitar amplifiers.

The full amplifier weighs 12 pounds, literally pinky-weight, can be carried by one finger and provides great tube tone anywhere from any power source.

The new amplifier provides 50 watts clean power and 85 watts at full output tube distortion.

Pure, warm tube tone-cleaner cleans, dirtier dirties, and heightened emotions are provided.

Wide spectral slam, coherence, precision and maximum musical trueness result.

Extremely dynamic, rich and full tones sustain without droop at any volume. The new amplifier is lightning quick, with no distortion hangover, and is fully responsive on a per-note basis.

The new amplifier provides control of the resonant converter in a way similar to juicing the amplifier and pedals to distort sounds.

The new amplifier provides communication between the power factor controller and the resonant converter to prevent surges and to respond to shut down and cycling of power when power comes back on.

The new amplifier synchronizes the power factor controller and the resonant converter to prevent internal interference noise.

The new amplifier looks at the incoming audio signal 2-3 milliseconds before the signal goes to the audio stage to prevent droop. The digital voltage controls are at least 25 times faster than the audio signal, which allows time to charge voltages on tubes and prevent delay or droop.

The solid state plate-step laddering control with 8,410 or 16 inch 8 diode bridges steps to provide 800 volts in steps of 100V to the plates of the vacuum tubes.

The combinations of the laddering Power-Step control of the grids and the plate-step control of the plate provide hundreds of different amplified sounds with undistinguishable millisecond changes.

Plate-steps are added to the ZOTL outputs that are described in U.S. Pat. No. 5,612,646, which is incorporated by reference, as if fully set forth herein.

Ultra linear operation exists in a hi-fi tube amplifier most commonly as a tapped transformer. This incurs two conditions: (1) a fixed percentage of AC signal is available from the transformer and (2) a single DC voltage (the "B+") is also present.

However, not widely known is that high screen voltage (e.g., equal to plate voltage) is a major source of tube stress and potential failure. Eighty percent of tube failures are related to relatively too high screen grid voltage and internal electrostatic field stresses.

Berning ZOTL U.S. Pat. No. 5,612,646 allows for a variety of taps, not just one, and each tap provides not only some percentage of AC plate signal but also some percentage of DC plate voltage.

This invention provides a new SuperLinear technique.

Reduced screen DC voltage boosts reliability. However, lowering screen DC voltage is not easily possible with the traditional tapped transformer method of ultra linear operation, because the same DC is present on the winding no matter where it is tapped. The tapping only affects the percentage of AC, not DC which is fixed at B+ plate voltage.

Adjusting DC voltage on a screen also significantly affects power and tube tone, overload and response characteristics, as per the Power-Step control, which applies various DC voltages to the screen grid to limit power output.

Moreover, any variable AC and/or DC source such as by Power-Step can be added to or subtracted from the new SuperLinear AC signal to affect tone, overload and response. The new system is not limited to the AC and DC signal present on the ZOTL diode stack or even the signal coming from the instrument or power tube vocoder.

The new SuperLinear signal from the push tube's diode stack can be applied to the pull screen grid and vice-versa, independently, giving some portion of 180-degree inverted signal, yielding different kinds of sonic wildness created inside the power tubes themselves.

It also is possible to mix any kind of pre-distorted signal onto the screen grid, letting the power tube itself generate the result.

These effects can be applied to all tubes together or to any combination of the tubes, all independently variable.

The new SuperLinear system is, therefore, both (1) an improvement for reliability to the familiar ultra linear technique; and (2) a brand new kind of power tube distortion mechanism.

The new amplifier provides variable control over grid drives and cathodes, grids and plates with transitional digital controls versus slower analog controls.

The new drive uses the controls for different kinds of tubes and compensates for interferences, uses ZOTL control over output tubes and blocks or limits individual outputs with switches or potentiometers. As an example, eight different outputs may be controlled by turning down selected tubes, leaving all tubes in or turning off or lowering selected tubes.

Variable screen control is provided with one Power-Step control from 100-250V applied to all four output tubes and independent variable pet tub Power-Step control.

The new amplifier has P3 power output to pedals to push or diminish power to all pedals or groups of pedals connected to P3 power outputs and audio signal inputs.

The new amplifier provides auto-everything—literally plug and play. Use any type of output tubes, in any combination, without manual biasing. One output drives any common load and sustains dead-shorts, total opens.

The new sophisticated power supplies plug in anywhere and regulate optimally.

The new Power-Step™ reduces volume and maintains output tube overdrive character.

No more batteries are required for the new P3 Pedal Power. Never be dead on arrival (DOA) for a performance or landfill another 9 volt battery.

Uncommonly reliable ten-year tube lifetimes are common in our other products. The new amplifier uses fresh ideas, smart features and is American made to treasure forever.

The new lightweight 50 watt amplifier provides the ultimate in tone control and may play different tubes for different tones. Escape matched pairs requirements or even matching tube types. Set tone using whatever tubes you like, in whatever combination. Never fuss with bias again, yet enjoy automatically optimized performance every time. Gain immediate and full control over what the louder part of your instrument sounds like. Get back to basics: reliability, purity, elegance, and total tube warmth, feel and tone. Great sound is produced from best ingredients.

Specific features and capabilities that are new and novel include:

1. RESONANT POWER CONVERSION—Resonant converters or quasi-resonant type converters with Switch Mode Power Supply (SMPS) topologies, whether ZVS or ZCS or some other type, are used to soften the otherwise fast and hard-edged switching transients that cause undesirable ultrasonic harmonic ringing, interference and noise. A resonant converter may be used as a primary power converter in TNA, and/or as a sometimes-required Power Factor Correction (PFC), both on the primary side as power switches and on the secondary side as synchronous rectifiers. The importance of minimizing switching noise generation apparently neither has been realized nor has been explored by most manufacturers. Resonant type converters are harder to create and are more expensive to develop and implement. In TNC resonant type converters increase efficiency and reduce noise by softening the primary switching and secondary rectification, and these features are vital to reducing noise. TNA uses resonant conversion and other techniques to minimize unwanted noise.

2. MULTIPLE PROTECTION AND MONITORING INPUTS FOR RESONANT CONVERTER CONTROL—Voltage sensing circuitry "folds back" the resonant converter by magnetically saturating a control winding, thereby reducing operating frequency and available power. Multiple voltages are watched, and errors made are used to cause foldback, while providing fast feedback during normal operation.

3. POWER BOOST WITH PREDICTIVE AUDIO SENSING—TNA looks at the incoming audio signal 2-3 milliseconds before the signal goes to the audio stage to prevent droop. The digital voltage controls are faster than the audio signal, which allows time to change voltages on tubes and to prevent delay or droop.

4. CONTROL AND SHAPING OF POWER CONVERSION WAVEFORMS—Digital control and shaping of the switching waveforms and feedback signals in TNA further improves efficiency and reduces noise. Various methods of adjusting switching frequencies and disabling unneeded components, particularly at lighter power load demands, significantly improve efficiency, reduce heat and noise and improve performance. For example, the phase-shifted full-bridge resonant converter extra switching losses are eliminated at light loads by disabling switching of synchronous MOSFETs and using instead their inherent body diodes for conduction. These and other techniques, particularly those which take advantage of inherent device characteristics, are used throughout various embodiments of TNA.

5. MULTIPLE GROUND PLANES AND RADIO FREQUENCY TECHNIQUES FOR MINIMIZING HUM AND NOISE PICKUP—The physical layout of components, the grouping and arrangement of component sets and the interconnection of the various circuits in TNA is purposely made to reduce hum and noise. Typical tube amplifier power supplies operate at 60 Hz and are laid out and grounded without particular regard for supersonic noise precautions. TNA takes special care: to separate functional circuits into different ground planes sharing approximately equal voltage reference, to further separate and arrange these different ground planes, particularly to reduce noise generation, pickup, transmission and amplification, and to further interconnect these various ground planes and to apply shielding to preclude unwanted noise. Typical amplifiers use the chassis as a single, large ground return with no particular or very rudimentary regard for noise reduction by sectioning or interconnection. Shielding is also practically non-existent in typical amplifiers. Lack of shielding is so, presumably because typical amplifiers never had to deal with supersonic power supplies and their audibly unwanted beat-frequency byproducts. In one embodiment of TNA, an active virtual ground is generated using active devices which sense, compensate and overpower the noise and interferences generated by the power supplies, thereby precluding its unwanted pickup and amplification.

6. POWER SUPPLY INTER-COMMUNICATION—TNA in some embodiments uses communication among the Power Factor Controller (PFC) and the resonant converter (RC) or the various other power conversion modules to prevent surges and to respond to changes in line or load, shut down, or cycling of mains power. Digital communication among power switching and regulation stages is improved to provide predictive feed-forward compensation for varying main supply, for pre-adapting to changing audio input signals, and for comprehensively handling fault conditions, regardless of where in the system any fault may occur. That also extends to protecting against catastrophic damage caused by an electrical short-circuit of the fragile power tube screen grids, for example.

7. MAINS SUPPLY BOOTSTRAP—Power tapped from the ultrasonic switching of the resonant converter, once sufficiently energized, is used to ultrasonically energize the mains supply "bootstrapping", keeping it in a constant ON state, versus switching OFF at each zero-crossing of the 60 cycle line-frequency mains power. Examples of similar applications of characteristics used to compensate for or take advantage of characteristics of particular components, devices or subsystems used in TNA are a hallmark of TNA in general. Another example is the use of matching ultrasonic AC for power tube heaters to prevent unwanted beat frequency modulation that otherwise always occurs because power tubes internally present significant and inescapable cross-talk between their heater filaments and other amplifying elements. In other words, the overall invention was not simply cobbled or bolted together and thus cannot easily be separated. TNA has been interwoven as a system in which certain aspects compound or compensate for other important aspects.

8. MONITORING AND COMPENSATION OF VACUUM TUBE PARAMETERS—TNA incorporates various analog and digital techniques to measure operating and performance parameters of vacuum tubes, provides indicative feedback, and compensates as necessary and/or as directed. For example, whereas a power tube fault may lead to prolonged inability to correctly establish bias, that is noticed by the power supply logic which causes the necessary supply to reduce, fold-back, and/or inactivate.

9. MAINS SUPPLY SLOW-START—A Slow-Start Circuit (SSC) in an embodiment of TNA extends startup period of the mains supply to assure its primary boosted voltage comes up slowly without stressing the filtering capacitors. This slow-start feature is necessarily made compatible with the resonant converter.

10. SLOW-START RESONANT CONVERTER CIRCUIT—A Slow-Start Circuit controls startup of the resonant converter to assure all voltages come up relatively slowly (over a period of a few seconds) to prevent "cathode stripping", fuse blowing, and other unwanted results of powering up instantly. The Slow-Start Resonant Converter Circuit (SS-RCC) is compatible with the Auto Bias Circuit (ABC) so musical transients (auto-bias adjustments) do not cause a power-on reset condition, and the Auto Bias Circuit does not begin operation until the slow-started voltages reach operating levels.

11. DIGITAL CONTROL AND DRIVE OF POWER SUPPLY—To minimize noise and maximize performance and efficiency, digital control of the SMPS is implemented. This includes "look-ahead" pre-compensation that adjusts or boosts available power depending upon audio input signal and also upon changes in supplied mains voltage. TNA looks at the incoming audio signal 2-3 milliseconds before the signal goes to the audio stage to prevent droop. The digital voltage controls are faster than the audio signal, which allows time to charge voltages on tubes and prevent delay or droop.

12. SELF-QUENCHING POWER CONVERSION—The natural tendency of the type of resonant converter used in TNA is to reduce in operating frequency. The circuit is created so that reduced operating frequency causes a reduction in total power output. Most faults that may occur will tend to reduce operating frequency. Therefore, faults tend to cause a natural reduction in power conversion. Instead of an inherently positive-feedback system that might "runaway" with wild voltages, increased power, and ultimately self-destruction, the power conversion applied in TNA is comparatively self-quenching in the event of most faults.

13. SELF-QUENCHING AUTO-BIAS CIRCUIT—This general circuit arrangement is also true in the Auto-Bias Circuit, insomuch as a tube fault tends to cause the circuit to reduce plate current in the power tubes as opposed to increasing plate current in a destructive runaway under fault conditions.

14. USE OF ZOTL FOR GREATER AND IMPROVED DISTORTIONS FOR MUSICAL INSTRUMENT AMPLIFICATION—ZOTL is employed in TNA with adaptations created to selectively increase overall harmonic and non-harmonic distortion as well as to more perfectly couple the transfer characteristics of vacuum tubes and their resulting, sometime inherent, sometimes optional, distortions to speaker loads created for musical instrument amplification. This new creation contrasts the typical hi-fi ideal of pure amplification, and its application is extended to the Plate-Step and Screen Step, Screen Modulation, Super Linear Operation, Feedback Coloration Circuitry, and other circuit networks described herein.

15. MULTIPLE ANALOG POWER FEEDBACK NODES—TNA's resonant converter allows for voltage sensing circuitry that upon over-voltage error "folds back" the resonant converter by purposely magnetically saturating a controlling core, thereby reducing available power. One benefit is that multiple voltages can be easily and quickly monitored for error conditions and automatic feed-forward and feedback adjustments.

16. ULTRASONIC POWER REGULATION—TNA recharges and regulates all voltages ultrasonically, keeping the sound from drooping or sagging under load, a common characteristic of other tube amps. Because TNA does not droop or sag, audio signals uncommonly sustain for as long as they are held by the instrument or performer.

17. ULTRASONIC HEATER SUPPLY—Power tubes used in TNA operate in part at supersonic frequency. To prevent noise and interference from audible beat frequencies, the tube heaters are also operated at supersonic frequency or are only partially filtered.

18. ADJUSTABLE TUBE HEATER VOLTAGES—Tube heater voltages may be independently controlled in TNA to yield various types of desired distortions and signal nonlinearities. Small signal tubes in TNA may be operated at varied or modulated voltage, or at a fixed voltage selected so as to have an audibly distorting effect on the signal being amplified. This includes harmonically and non-harmonically related modulations, with or without user control, as well as supersonic or periodic bursts, which may be used solely or mixed in with some modulating signal, that are created to cause desirable excitations in the amplified signal. Externally generated and applied magnetically induced modulations, either for heating or signal injection or modulation, are also possible and desirable in embodiments of TNA.

19. FAITHFUL AMPLIFICATION USED TO CLARIFY AND EXAGGERATE DISTORTION—The use and extension of David Berning's patented ZOTL Technology in an arrangement for purposely and variably coloring musical instrument amplification vs. usual ideal purity of amplification. This has many other implications, including the Plate-Step and Screen Step, Screen Modulation, Super Linear Operation, and Feedback Coloration Circuitry. For example, the power tube plates may be independently connected via switch or suitable circuit to the ZOTL diode stack at different heights to achieve different voltages, impedance ratios, and therefore different transfer characteristics and ultimately tonal effects. This concept is also embodied in some versions of TNA with regard to the screen voltage tap connections and/or circuits.

20. SCREEN GRID PROTECTIVE DIODES AND NETWORKS—Power tube screen grids are notoriously unreliable when plate current flow is driven high, thus also increasing screen grid current, and resistors have classically been used to limit unwanted screen grid currents, particularly due to physical failures within the power tubes. TNA augments resistors with diodes and other passive networks to further guard against unwanted screen grid currents, protect the screen grid supply and circuitry, reduce catastrophic internal power tube failures, and to also effect tone shaping. For example, a diode can dramatically improve failure resistance and practically cut unwanted screen grid currents while also non-linearly affecting signals applied to or passing through the screen grid, with the overall effect of creating or adding desirable distortions. Another example used in some embodiments of TNA includes a single diode facing one direction with a suitable resistor to limit current, in parallel with multiple diodes facing the other direction, sometimes with additional components for desirable tone shaping. In some embodiments, these networks involve other active elements.

21. FEEDBACK COLORATION CIRCUITRY—Adjustable filtering applied to the feedback signal allows for dramatic manipulation of distortions, output impedance, speaker damping, touch and feel, and audible and measurable performance. Other amplifiers offer basic manipulation as "presence" control. TNA may take this to extreme with complex filtering networks, as well as split-rail floating virtual ground operation.

22. INTER-MODULATION DISTORTION (IMD) EXCITATIONS—Ultra-, sub-, and inter-sonic excitations may be introduced, which are meant to heighten certain desirable distortions, including inter-modulation distortion (IMD). TNA applies one such technique by way of a "bright+ brighter" switch which overloads small-signal pre-amp tubes (e.g., 12AX7) with high-frequencies and causes them to introduce a kind of distortion described as "sparkle". In band-limited systems, such as 12-inch speakers most common in guitar speaker cabinets, extreme overload and subsequent distortion of high-frequency content has proven highly desirable. While some other amplifiers have offered ability to increase "treble boost", TNA extends this with concurrent, multi-source enhancement and can include extra, harmonically and/or non-harmonically-related frequencies to cause further specific, desirable excitations and resulting distortions.

23. BRIGHT/BRIGHTER SWITCH—Remotely or directly controlled switches and/or relays that switch in or out different combinations of components are chosen to change the response, character, tone and performance of the amplifier. Example: A typical "bright" switch connects or disconnects a capacitor across part of a potentiometer; whereas, our application connects and/or changes two or more component values in different places in the same circuit or in multiple circuits, the purpose of which is to change response, character, tone, performance in multiple places for additive or corrective/compensating function with one switch (e.g., increasing gain before amplification, particularly to achieve specific Inter-Modulation Distortions (IMD) or other effects due to high-frequency exaggerations, then decreasing gain afterward to compensate and prevent overloading subsequent circuitry. While "bright" switches have been done before, the new switches applying multiple components to act on different parameters or circuits for purpose of addition, exaggeration or compensation of effects have not been done before.

Note, a Chinese study and white papers from http://milbert.com/articles describe how high frequencies increase brain activity.

24. INTER-DEVICE SYNCHRONOUS OPERATION FEATURE—TNA allows some or all of its power supply switching frequencies to be a "clock source" for, or to synchronize to an externally-provided clock source signal, the purpose of which is to reduce overall system noise by preventing multiple different switching frequencies among connected audio components to interfere and introduce unwanted beat-modulations and noise.

25. VARIABLE FREQUENCY RESONANT CONVERSION—Multiple power supply topologies in TNA that may be averse to synchronous operation are instead operated with far separated switching frequencies and/or with switching frequencies that vary in relation to each other and to the instantaneous line and load conditions. This is done to keep any beat frequencies well out of the audio band and thereby to preclude unwanted amplification of switching frequencies or artifacts thereof. TNA synchronizes some or all of the Power Factor Controller, the resonant converter, and the ZOTL Converter to reduce beat frequencies and inter-supply noise.

26. AIR-GAP FIELD SPACER—The Resonant Inductor used in TNA's Power Supplies necessarily has an "air-gap" cut away from its center leg of magnetic material to decrease saturability and increase energy storage. The bobbin includes an "air-gap spacer" placed around and directly over the center-leg's air-gap. Its purpose is to keep the inductor's windings out of the air-gap area or "field" and more confined to the upper and lower regions of the bobbin where the permeability of the underlying magnetic material is concentrated and not interrupted by any air-gap. This simple geometric change to the windings substantially reduces operating temperature and noise, and it also improves power conversion efficiency. A bobbin specially formed to include this spacer may be used in TNA; although, any non-conductive material (i.e., wire-tie) may alternately be used as a spacer. This spacer should so wide as to preclude winding over the air-gap distance itself plus an additional 5 to 10% distance, to escape field fringes. This is unique to TNA's Power Supply in general.

27. MAGNETIC AND SEMICONDUCTOR SONIC INDEPENDENCE—It is a major purpose of TNA to escape the limitations of traditional audio-frequency magnetics so that the sounds and performance characteristics are no longer dependent upon audio-frequency magnetics. Power tubes, which provide 100% of audio power amplification, are more perfectly coupled to the speaker load and more accurately convey the transfer characteristics of the power tubes. Speaker load characteristics are also conveyed more perfectly back to the power tubes. Importantly, traditional magnetics are removed from the system, improving performance and lessening physical bulk, without resorting to typical "hybrid" circuit schemes in which tubes amplify voltage but then audio power is provided by semiconductor circuitry.

28. P3 VARIABLE VOLTAGE—The P3 System in TNA may vary the usually required 9V DC power within ranges of pedal limits. TNA provides for adjustment of output voltage (s) of the incorporated P3 Technology (U.S. Pat. No. 7,820,904 is incorporated by reference as if fully set forth herein) to be varied over some range, meant to cause desired tonal effects (e.g., "voltage sag", "brown sound") in connected effects pedals.

29. STEPPED AND MODULATED SCREEN GRID POWER SUPPLIES—Adjustable voltage steps applied to screen grid internally limit current and thereby adjust transconductance of the power tubes. This "screen voltage" may be modulated, to add a "leslie" type/tremolo effect (i.e., warbling volume), or to inject other signal to create desirable audible distortions, using the power tubes as modulation devices to multiply the "clean" and distorted signals, or to cause the total output power to be reduced, which is desirable for attaining characteristic "power tube type crunch" distortion at lower than full-blast volume levels. Adjustable bias voltages and/or plate voltages may be applied to compensate as the operating point of the power tubes changes (due to changing screen voltage).

30. SUPER-LINEAR TECHNIQUE—TNA involves a new kind of operation to the power-step circuitry. The patented "ultra-linear" operation involves a primary-side tapped audio transformer delivering a percentage of primary audio waveform that appears across the plate and cathode to the screen control grid. In this way the screen voltage/electrostatic field is also modulated and does not present a set voltage field. The result is a more linear operation as the screen scales in voltage and mirrors the plate, maintaining its overall percentage difference related to the plate. (See Hafler U.S. Pat. No. 2,710,312). This Super-Linear Technique may be applied to some or all Power Tubes as a single common supply, or as independent supplies of varying voltages or power, to cause varying and possibly user-selectable distortions.

31. STEPPED SCREEN VOLTAGE "POWER-STEP"—A switch provides fixed voltage "steps" to the screen grids to internally adjust the transconductance of the power tubes. This may be operated independently from or in conjunction with the Plate-Step and bias voltages. TNA includes an ability to switch various voltages to the power tubes' screen grids (together, independently, or in some combination) in a stepped or variable manner. Fixed or harmonically- or non-harmonically related modulated voltages (or some combination thereof) may be applied to control output power, distortion and tone, using the tubes as heterodyning mixers. No audio output transformer need be involved. This allows for reducing output power while maintaining transfer characteristics and output tube overdrive character. For example, an extremely distorted version of the input signal may be applied via the Screen Power-Step, and the output tubes correspondingly multiply the distorted and non-distorted signals.

32. PLATE STEP—Plate-steps are added to the ZOTL outputs that are described in U.S. Pat. No. 5,612,646, which is incorporated by reference, as if fully set forth herein. This allows the power tubes' contributions to power amplification to be independently controlled. This adjustment may also be modulated manually or electronically (smoothly or in stepped manner) for various "tremolo" or other interesting effects, including mute.

33. DIGITALLY CONTROLLED MULTI-NODE TRANSCONDUCTANCE MODIFICATION—One embodiment of TNA employs digital control to adjust voltages applied to the screen grid as well as bias voltage and control grid signal level. Plate voltage may also be modified under digital control. This allows for accurately and repeatedly adjusting the power transconductance while maintaining power tube transfer characteristics without negatively affecting "feel", "tone" and performance of TNA except the desired reduction of power.

34. FACILITY TO INSERT AND REMOVE POWER TUBES WITHOUT UPSETTING BIAS OR REQUIRING MANUAL ADJUSTMENT—Modifications to the ZOTL circuitry made to work with additional circuitry used in TNA allow for power tubes to be inserted or removed from the circuit, even during operation, without requiring manual adjustment.

35. UNLIMITED CONTROL OF POWER TRANSFER CHARACTERISTICS—The combinations of the Power-Step and Screen Step grid controls along with analog controls (and digital controls in some embodiments of TNA) provide virtually unlimited modification of amplification (and distortion) transfer characteristics.

36. DC-COUPLED POWER TUBE STAGE—Offers improved frequency response, is extremely fast (no R-C time delays), has maximal phase coherence (no phase skew), and does not upset bias (or delay bias recovery) with overload "blocking" distortion.

37. IMPROVEMENTS TO P3 TECHNOLOGY—TNA includes improvements to the P3 Technology (U.S. Pat. No. 7,820,904 incorporated by reference as if fully set forth herein). An "instant" and highly-responsive circuit-breaker prevents over-current by disconnecting large energy storage capacitors to prevent damage during short-circuits of the output. TNA also uses multiple, independent linear regulators to provide additional output voltages via various types of output connectors, not just the ring of TRS.

38. P3 CONTROL CIRCUIT—P3 Control Circuitry monitors short-circuit conditions in the Ring circuit of the input jack (e.g., including stereo or TRS cables and pedals, pickups or electronics powered therefrom) and instantly disconnects energy reserves from the Ring terminal, and thereby prevents short-circuits (made during connection/disconnection of guitar, pedals, pickups, other electronics) from receiving possibly damaging and unwanted high-current. The P3 Control Circuitry also provides switch debouncing, ensures a (selectable) power-up condition of either ON or OFF, and offers an option to attempt restart (i.e., power ON condition) after short-circuit for a certain time period and/or number of attempts.

39. GREATLY EXTENDED TUBE LIFETIMES—TNA provides for greatly extended power tube lifetimes via its careful and proper application of heater voltages and using high-voltages in high-impedance circuitry created to reduce operating currents and temperatures. This involves the ZOTL Technology and to the advanced power supplies.

40. QUADRATURE OPERATION OF ZOTL—The ZOTL ladder may be operated in reverse, resulting in high negative voltage that may then be applied to properly configure amplifying devices and circuitry. In this manner, energy transferred during both swings of the ZOTL Converter magnetics can be harvested and applied toward available output power.

41. DIRECT COUPLED POWER TUBE STAGE—TNA uses a fast-responding, directly-coupled power output stage that is uncommonly quick to respond, with no distortion hangover, and is fully responsive on a per-note basis. This is in contrast to typical amplifiers whose circuitry does not prevent "bias collapse" of the output power tubes.

42. SPECIFIC MAGNETIC WINDINGS—Primary windings of particular number, gauge, style, winding arrangement, and insulation must be selected to improve efficiency and performance of the ZOTL Technology Impedance Converter. Secondary windings require similar attention.

43. SPLIT-BOBBIN SPLIT-PRIMARY BI-FILAR WINDINGS TUNED FOR EFFICIENT ULTRASONIC SWITCHING WITH REDUCED LOSSES—Primary windings of particular number, gauge, style, winding arrangement, wire type ("Litz" and "flat foil" types) and insulation are used in TNA to improve efficiency and performance of the ZOTL Technology Impedance Converter. Secondary windings use similar attention for maximized energy transfer and efficiency. Operating at ultrasonic frequencies and using non-traditional waveforms allows for maximized efficiency, as determined empirically.

44. PEAK-DETECTING SAMPLE-AND-HOLD AUTOMATIC BIAS—Using sample-and-hold peak-detecting circuitry or digital sensing and control techniques using microprocessors or discrete digital circuitry, combined with the uncommonly high-impedance presented by the ZOTL Technology Impedance Converter, allows any compatible power tubes to be used in any combinations or numbers (i.e., 2, 3 or 4 tubes), a feature important for tailoring transfer and performance characteristics. In contrast, traditional amplifiers use rudimentary "cathode bias" or "fixed bias" operation.

45. AUTOMATIC STANDBY—Typical vacuum tube musical instrument amplifiers offer a "standby" switch to reduce operating currents (and thus wear) during periods of silence without completely powering down and cooling the tube heaters. TNA operates its power tubes at such high impedance that plate current flow during normal amplification is comparatively minimized, and standby current drops to such small amounts (determined by each power tube) that a traditional "standby" switch is obviated. TNA is always ready to leap from idling to full power without hesitation with sonic seamlessness, and without requiring any standby/operate switch or mechanism common in other amplifiers.

46. INDEPENDENT ADJUSTMENTS FOR POWER TUBE OPERATION AND SONIC CONTRIBUTIONS—Circuitry in TNA allows for independent adjustment of each power tube's operation and involvement in providing output power, by using switches or potentiometers to adjust control grid signal, screen grid voltage or signal, and/or connection or full- or partial-float of the suppressor grid.

47. NEW KINDS OF DISTORTIONS AND SOUND SHAPING—The combinations of the laddering Power-Step control of the grids and the plate-step control of the plate provide hundreds of different amplified sounds with millisecond changes. The solid-state plate "ladder" control with diode-bridge steps provides up to 800 volts in steps of 100V to the plates of the vacuum tubes.

48. BLOW-PROOF OUTPUT—Auto-Output-Impedance and "blow-proof" protection avoids or prevents high-voltage arc-over and winding destruction by means of using ZOTL Technology or other technologies rather than traditional audio-frequency output transformers or typical "hybrid" semiconductor circuitry.

49. MANIPULATION OF ZOTL CONVERTER CIRCUIT—By manipulating the ZOTL Converter circuit in various ways, unique to TNA, an unusually wide variety of new kinds of distortions and amplification characteristics are attained. Whereas the ZOTL Converter circuit alone is created to maximize sonic purity by improving faithfulness and accuracy of amplification, the ZOTL Converter as applied in TNA is purposely made to deviate, sometimes extremely so, into absurd audible distortion. Uncommonly accurate phase coherence enabled by the ZOTL Converter is selectively passed through by TNA, or else the phase coherence is severely, though purposely, mitigated and even greatly modified, for the purposes of attaining desirable audible distortions.

50. INCREASED DISTORTION MECHANISMS—TNA provides many combinations of the Power-Step "laddering" control of the various grids within the power tubes provide hundreds of different amplified sounds with various desirable distortion characteristics.

51. INCREASED CONTROL OVER VACUUM TUBE OPERATION—TNA provides independent, variable and and/or digital control over grid drives and cathodes, grids and plates to increase available sonic palette.

52. BLOW-PROOF OUTPUT—Fed by the ZOTL Converter output, with or without a Zobel or other network, with or without a tap for negative feedback, TNA provides a blow-proof output.

53. DIGITAL SENSING AND CONTROL OF SPEAKER LOADS—Digital circuitry in one embodiment of TNA is used to sense the action of the speaker load and compensate, if necessary or as selected, for particular distortion characteristics. This puts the speaker and cabinet response within the feedback loop of TNA allowing for improved control and adjustment of desired performance, particularly regarding distortion characteristics.

54. UNIPOLAR SUPPLY—One embodiment of TNA includes a uni-polar output voltage supply that uses a large DC voltage blocking capacitor and autobias circuitry created to compensate the offset virtual ground. This method avoids the need for matching bipolar supply and reduces overall cost.

55. VARIABLE MAGNETIC OFFSET—In an embodiment of TNA, a DC voltage offset may be added to the signal supplied to the speaker load. The DC voltage offset, which may be positive, negative, or varying at subsonic frequency, moves the speaker's "resting" point within its magnetic domain. This shortens the possible excursion in one direction while lengthening it in the other direction. This variable offset from normally resting "center" causes a physical pre-distortion or compression, in that the speaker can move further in one direction than the other direction while reproducing amplified audio signal. The result is a new kind of distortion that is engendered by the forced asymmetrical response of the speaker within its altered magnetic domain. This offset may be additionally controlled by feedback from the speaker, the cabinet, a set of operating parameters, signal input, or user input. For example, an averaging sample-and-hold circuit is used to determine the overall loudness of the signal being presently amplified. As overall loudness increases, a progressively larger offset is added to the output signal; this causes distortions as the speaker is made to physically compress while moving in one direction sooner than in the other direction. Care is taken to prevent too large a DC offset from permanently damaging the speaker.

These and further and other objects and features of the TNA are apparent in the disclosure, which include the above and ongoing written specification, with the drawings.

BRIEF DESCRIPTION OF THE DRAWINGS

FIG. 2A schematically shows a SMPS waveform with leading edge spikes.

FIG. 2B schematically shows a SMPS waveform with leading edges rounded.

FIG. 13 schematically shows vacuum tube controls.

FIG. 14 schematically shows grid controls.

DETAILED DESCRIPTION OF THE DRAWINGS

Figure 1:
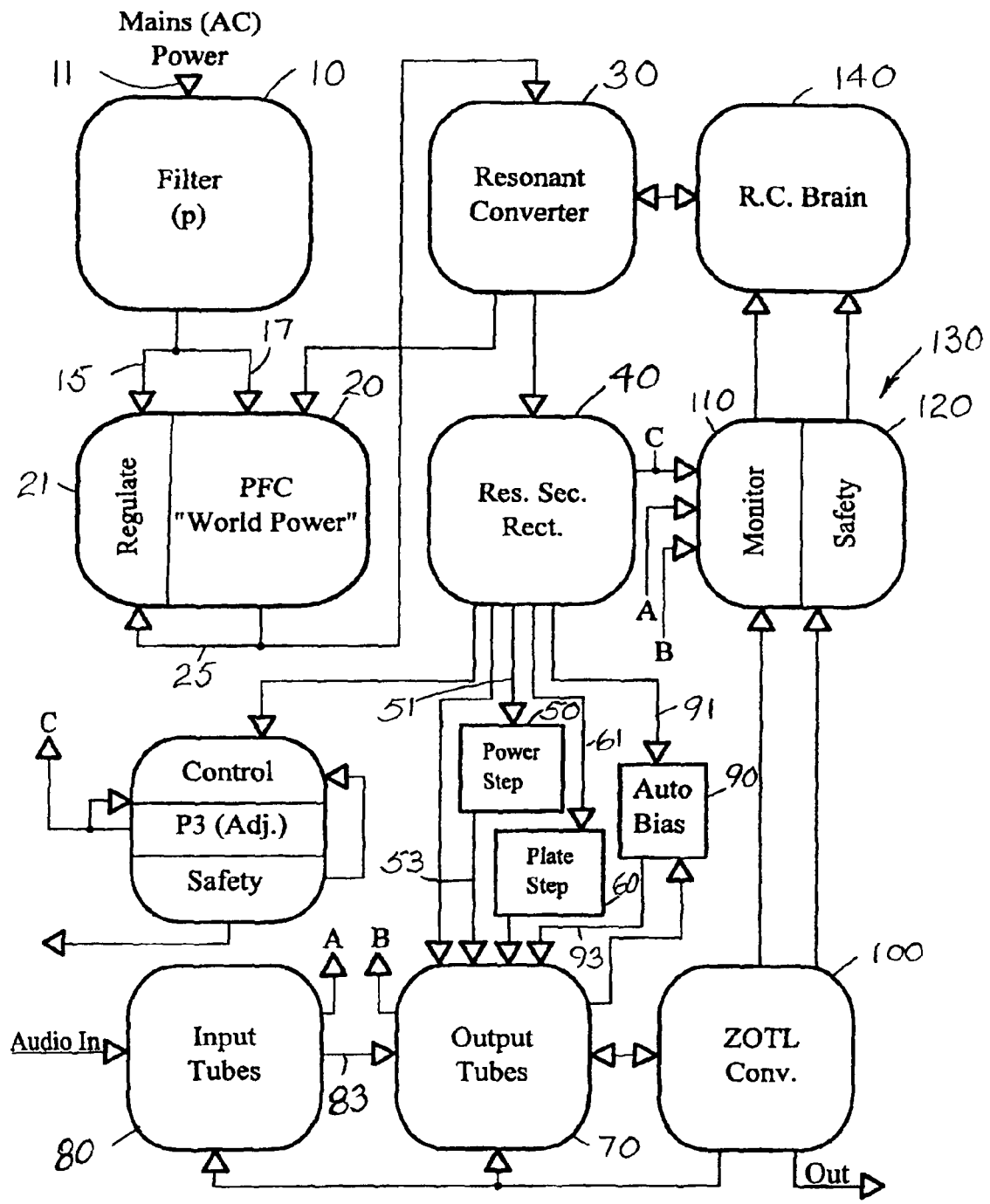
FIG. 1 is a schematic representation of TNA.

A power supply input filter blocks noise from going to the input mains of the new amplifier. Input filter 10 has an earth connection, an AC input 11, a fuse, a switch and a neutral connection. A 250 V AC and a smoothing capacitor and a resister are connected between the switch and neutral.

A first filter has capacitors floating between the power and neutral lines. A second similar filter leads to an AC-DC converter with positive 15 and negative 17 outputs to a power factor corrector.

A power supply power factor corrector PFC 20 allows the new amplifier to work anywhere. Power factor corrector 20 has inputs 15, 17 that receive any line voltage that has been filtered by the input filter 10. A boost converter has a boost inductor which boosts power to 375-400V DC.

The power factor converter 20 of the circuit has a regulator 21, an output 23, and a voltage loop 25. Over power protection regulates power and protects against voltage spikes. Switch frequency synchronization controls the main power stage. Voltage sense and feedback circuits controls the voltage out to a constant filter voltage, for example 77 V AC.

A power supply resonant converter 30 reduces the input voltage to a steady level and operates as the brains of the power supply for the new amplifier 1. The resonant converter 30 has power connectors 31 that provide 375-400 V AC.

The power supply resonant converter 30 controls current and voltage, and prevents overheating of the new amplifier 1.

The main power supply uses the 77 V positive DC to provide 12 V DC plate heater supplies. The heater supply uses energy recovery.

Main switching mosfets in the resonant section rectifier 40 have positive 375 V DC connections and power factor controller connectors to provide gate positive and negative and bridge outputs.

A screen voltage multiplier supplies power output from a source.

In the Power-Step 50 laddered capacitor, diode and resistance circuits receive 375V DC input 51 and provide a series of outputs 53 with 50 volt steps between 50 and 300 V.

A Plate-Step controller 60 receives 375V DC input 61 and voltage quadrupler, regulator and demotorboater circuits produce plate supply for power output tubes 70 in the new amplifier 1.

Voltage quadrupler, regulator and demotorboater circuits in the Plate-Step controller supply laddered capacitor, diode and resistance circuits to provide 240, 320 and 200 V positive DC outputs.

An audio input tubes preamplifier 80 of the new amplifier 1 has audio in 81. A pickup circuit controls a phase inverter. A three-way flip switch mutes or cancels 180° out of phase signals. An output from the switch is supplied to a low frequency roll off circuit and then to a tone drive buffer circuit, then to a tone stack circuit that provides the base and treble outputs 83.

The treble signal outputs are provided through a signal recovery circuit to a loop bypass in a loop switch. The treble output from the recovery circuit is also sent to a front effects loop for effect pedals inputs to the loop switch. The output of the loop switch is provided to volume control circuit and then to the audio preamp output 159.

Audio power output amplifier tubes 70 in the new amplifier have input from the audio preamp output 83 of the audio input preamplifier tubes 80. The input alters the positive V DC input to control the driver. Feedback from speaker output is also used to control the driver circuit.

An auto bias servo circuit 90 of the new amplifier 1 is provided with 160V positive DC.

An auto standby circuit operates a with a 20 second delay. A 320 positive DC 93 is supplied from the auto bias 90 to the power output tubes 70. The auto bias 90 reinjects controlled voltage to offset any loss.

A ZOTL 100 gate driver as shown in U.S. Pat. No. 5,612,646, which is incorporated herein by reference, is used in the new amplifier. ZOTL gate drive transfer transformers are provided in two parallel sets on pull and push.

The mosfets in the pull half core group are supplied with 77 V positive DC and are connected to speaker feedback. The mosfet in the other push half core group are connected between the speaker feedback and earth.

Transformers are connected to the mosfets and to the ZOTL gate drive outputs.

A ZOTL transformer has diode ladders in the new amplifiers. ZOTL transfer transformers are provided 160V positive DC supplied to diode ladders that provide stepped up voltages to the pull plate connections and to the push plate connections.

The input filter 10 is tuned to the power factor corrector PFC 20 parameters and sits entirely on the main circuit board.

The PFC (power factor corrector) converts any power mains on the planet to 375 VAC and also compensates for unwanted power factors caused by nature of the power supply, as required by CE and other regulatory agencies. The input filter keeps noise from the PFC from contaminating the mains lines (per FCC and other regulatory requirements) and also blocks ultrasonic noise from entering the new amplifier via power mains. Think of the PFC as the universal power supply for the main RC power supply. The PFC exists entirely on a daughterboard which plugs down into the main circuit board.

The RC (resonant converter) power supply is the main power supply for the new amplifier, providing regulated correct voltages needed to do its job: 12V tube heaters, main 77 VAC sources (to feed multiplier), etc. The RC is split across both the main circuit board (for the transformers and high current parts) and another daughter card. The brain for the RC shares this second daughterboard with the multiplier.

The multiplier (which is actually two separate voltage multipliers), driven by the main 77 VAC, generates several isolated voltages (160V, 240V, 320V, etc.) which are variously combined into necessary voltages.

The regulated 200 VDC input tube B+ voltage is generated by the multiplier, which also generates the 160 VDC base voltage for the output tubes as well as voltages necessary for the automatic biasing circuitry. The multiplier also creates the stepped ladder voltages (50 volts per step) used by the front-panel Power-Step control. This is the basis for the lossless power limiting available in new amplifier—lossless meaning that the transconductance of the output tubes is adjusted, rather than running them at full power but then wasting that power in heating big resistors in a hot plate as is common among other amps and power soak type accessories. The character of the sound is fundamentally different because the tube qualities are adjusted (power limited) rather than running them ragged. This also, we expect, greatly increases reliability and tube life.

The ZOTL circuitry is also partly on its own small, daughterboard. The tubes are mounted on the main circuit board.

Outside an internal metal cage are the four power output tubes 170. A separate metal fence around the output tubes 70 further shields the sensitive, high-gain input tube stages and front-panel controls, which exist on the main circuit board.

The monitor 110 and safety 120 module 130 receives inputs A,B from the audio input tubes A and from the output tubes B and inputs C from the resonant section rectifiers 40 as well as inputs from the ZOTL converter 100. The inputs are monitored and sensed for safety and outputs are provided to the resonant converter brain 140. The resonant converter brain 140 receives sensed voltage feedback and converts 400V DC to 77V DC to provide control voltages to the resonant converter.

The input filter 10 receives 120 or 250 VAC, blocks noise going through the power lines, has a fuse and a switch, step up transformers and a diode bridge with AC inputs and negative and positive DC outputs.

The power factor converter 20 is provided on the PFC board and provides integrated circuits for regulating and controlling switching frequency and synchronization to converters. The PFC board also contains diode switches, zenner diodes and transistors and transformers for converters and a mosfet controlled main powerstage. The boost converter and power factor correction enable connection of the input filter to any AC power source in the world.

The power supply resonant converter 30 is part of the motherboard and converts voltage to current at low voltage to heaters in the tubes to ensure that the tube plate heaters are always on and to prevent overheating of the heaters and plates.

The resonant section rectifier provides synchronized frequencies and control DC power levels to the P3, the output tubes 70, the Power-Step 50, the plate-step 60, the autobias control 90 and monitor/safety module 130.

The Power-Step 50 has a regulated 77V DC input and linear converter with impedance capacitors, and zenner diodes paired with a transformer for voltage multiplying. Laddered diodes, capacitors and resistors are arranged with 50V DC stepped outputs from 50 to 300V DC to selectively connect to output pentode tube screens.

The plate-step 90 has a voltage quadrupler, regulator demotorboater with an input of 77V DC from rectifier 40 and laddered diode pairs, capacitors and resistors to provide selectable varied output in 80V DC steps of 160V DC, 240V DC and 320V DEC to supply output amplifier plates.

Zenner diodes, resistors and a linear regulator supply 200V DC for preamplifier tube plates.

The audio preamplifier input tubes section 80 has six or more triodes. A first triode grid has an audio input from a tip of a tip-ring connector, cathodes connected to a grid of a triode in an inverter. The output of the inverter cathode is connected through a selectable low frequency bypass to a grid of a tone drive buffer and a base-treble tone stack.

The audio output tubes 70 have two paired (four) pentodes tubes and two triode tubes.

The autobias servo 90 biases the cathodes and receives feedback from the power output tubes 70.

The ZOTL 100 operates as described in U.S. Pat. No. 5,612,646, contains a diode ladder and steps up power to the output tubes. Module 130 monitors the entire system and provides safety controls to the resonant converter brain 140 that controls the resonant converter.

FIG. 2A schematically shows a SMPS waveform with leading edge spikes. Typical SMPS switching waveform 150 shows hard-edge, leading spikes 152, which denote ultra-high frequency signal content, manifesting as unwanted noise in high-gain systems.

FIG. 2B schematically shows a SMPS waveform with leading edges rounded. SMPS switching waveform 160 shows leading edge 162 of unwanted high-frequency noise softened 164. This denotes a trade-off of unwanted noise versus unwanted heat generated in the power switching devices.

Figure 3:
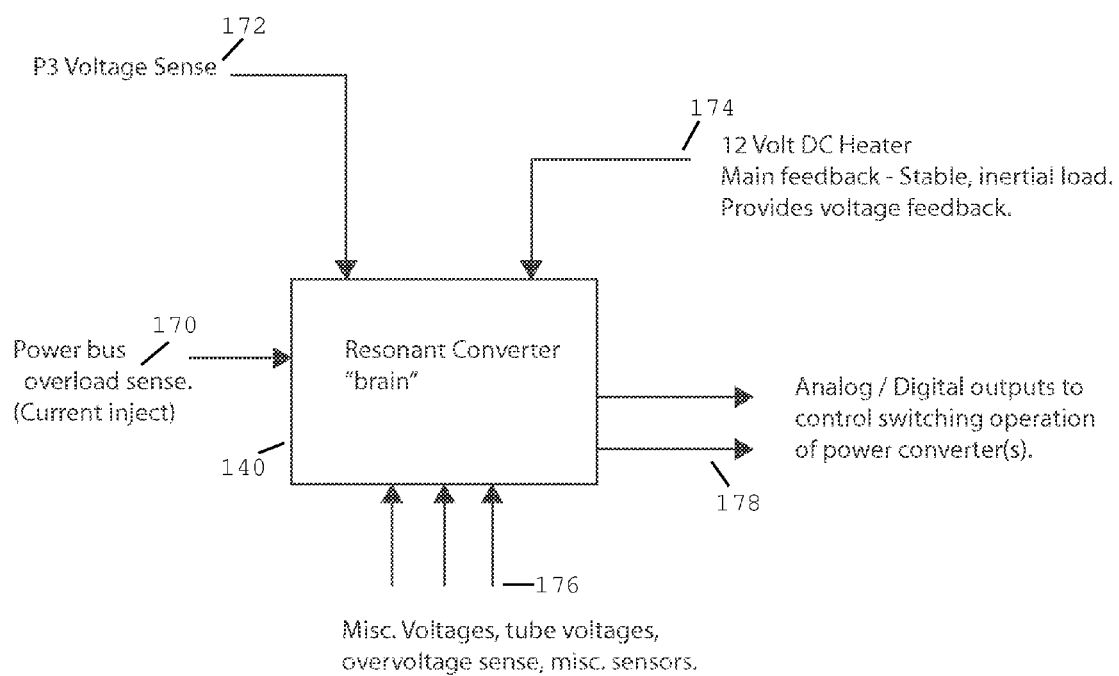
FIG. 3 is a representation of a resonant converter brain.

FIG. 3 is a representation of a resonant converter brain. Resonant converter brain 140 receives inputs from a power bus overload sensor 170, from P3 voltage sensor 172 and 12V DC heater voltage feedback 174, and from miscellaneous sensors 176, and uses the inputs to provide analog/digital outputs 178 to control switching operation of power converters.

Figure 4:
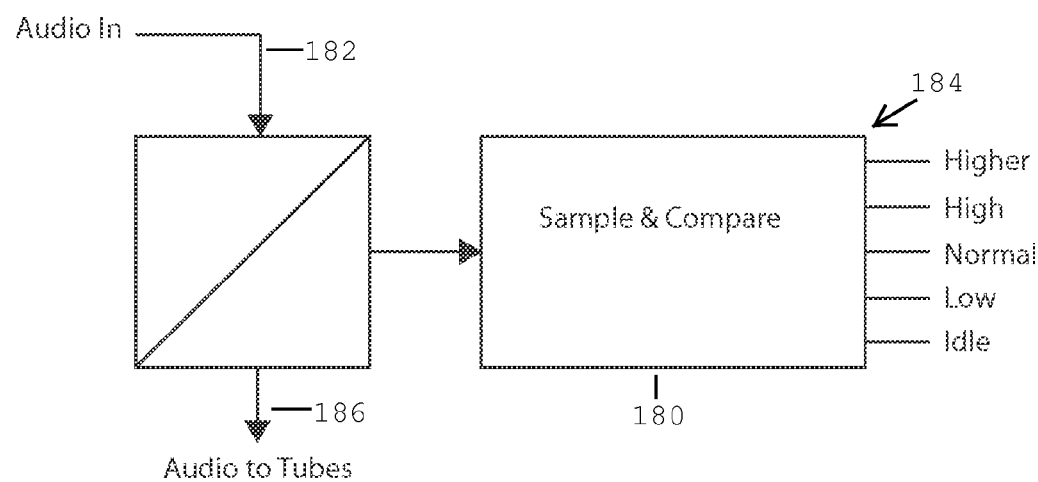
FIG. 4 schematically shows pre-sampling of audio signals.

FIG. 4 schematically shows pre-sampling of audio signals. FIG. 4 shows sample and compare circuits 180, sample audio-in 182 and compares the inputs with normal, high, higher, low and idle inputs 184. The feed brain pre-boosts in expectation of coming signal peaks, or auto-reduces during quieter/idle passages or periods.

Figure 5:
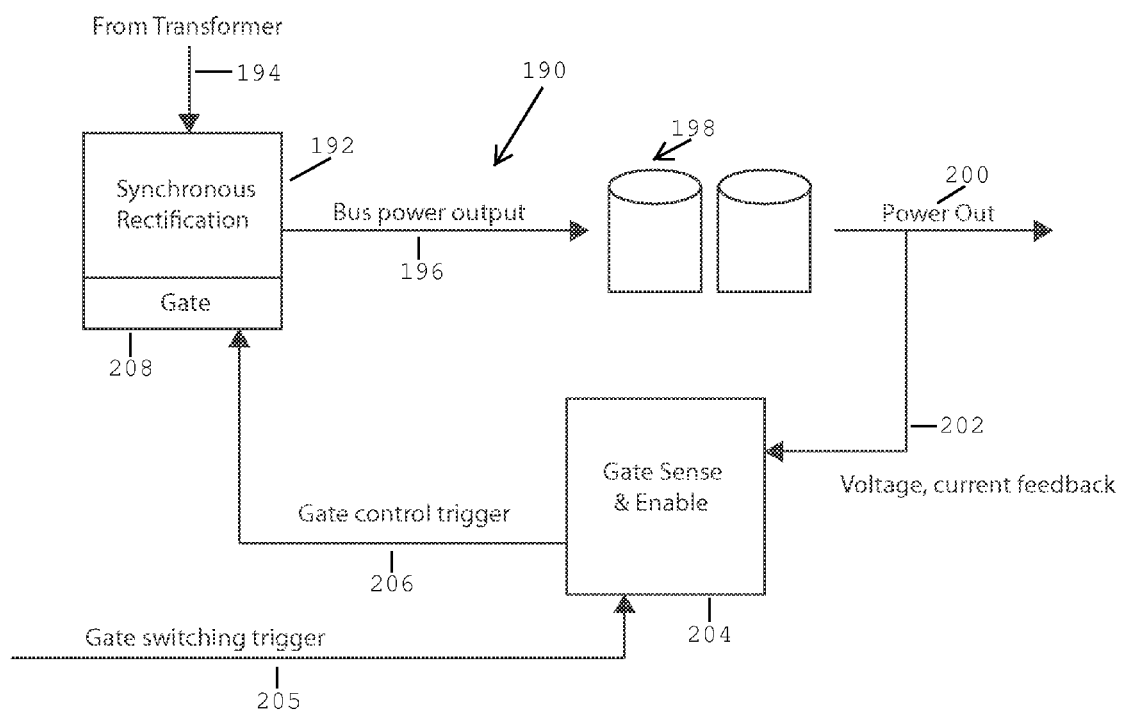
FIG. 5 schematically shows an amplifier power supply.

FIG. 5 schematically shows an amplifier power supply. Power supply 190 synchronously rectifies 192 power from transformer 194 and provides bus power 196 to components 198 and output power 200. A voltage, current feedback 202 is provided to a gate sense and enable circuit 204 which is triggered by a gate switching trigger 205 and provides a gate control trigger 206 to gate 208 and the synchronous rectification 192.

Figure 6:
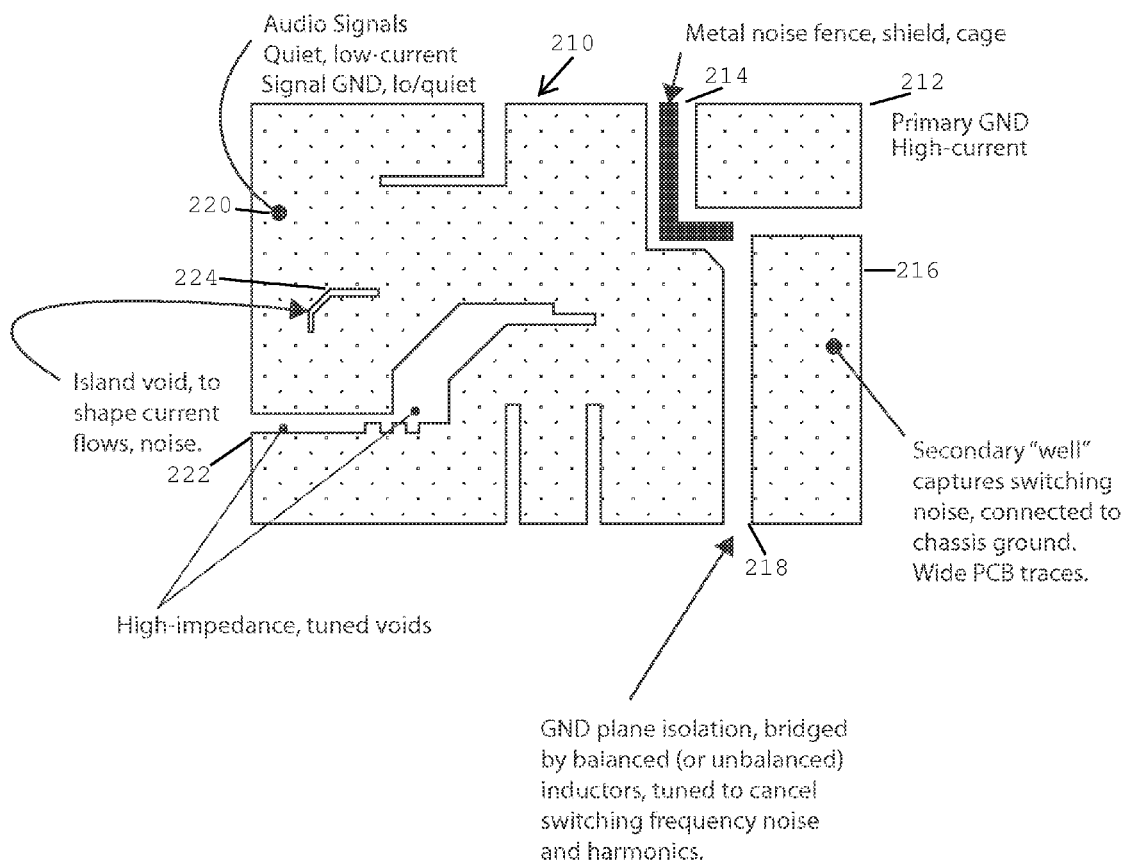
FIG. 6 schematically shows a ground plane.

FIG. 6 schematically shows ground planes. The ground planes provide separated grounds for different parts of TNA. Primary high current ground 212 is separated by a metal noise fence, shield or cage 214 from ground plane 210. A secondary well 216 captures switching noise and is connected to chassis ground. Wide PCB traces. GND plane isolation 218 is bridged by balanced (or unbalanced) inductors tunes to cancel switching frequency noise and harmonics. Audio signals quiet low current ground 220 is separated by high impedance tuned voids 222 and an island void 224 to shape current flows and noise.

Figure 7:
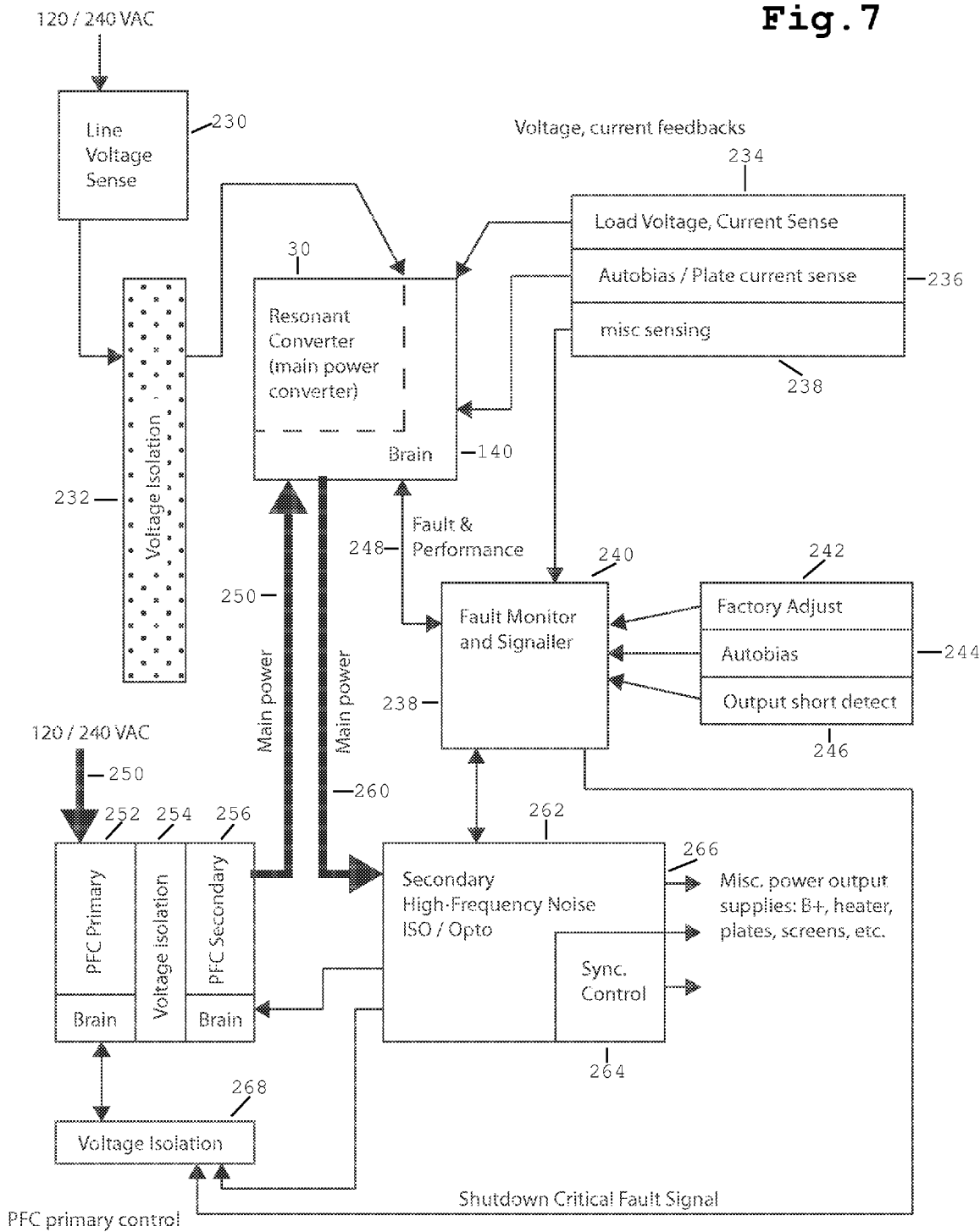
FIG. 7 schematically shows voltage and current feedbacks.

FIG. 7 schematically shows voltage and current feedbacks. A voltage sensor 230 senses 120 or 240 VAC line voltage. Power is supplied through voltage isolation 232 to main power resonant converter 30. Brain 140 is supplied from load voltage and current sensor 234, autobias sensor 236 and miscellaneous sensors 238. Fault monitor and signaler 240 has inputs for factory adjustment 242, autobias 244 and output short detection 246, and miscellaneous sensing 238, and communicates with brain 140 with fault and performance signals 248.

Main power 250 is supplied to the brain 140 and main power resonant converter 30 through a power factor control (PFC) primary 252, voltage isolator 254 and PFC secondary 256. The main power is supplied 260 from the resonant converter 30, 140 to the secondary high frequency noise suppressor 262, which with a synchronization controller 264 supplies power 266 to Bt, heaters, plates and screens. The secondary noise suppressor 262 is connected with the voltage isolator 268 to the PFC primary control 252.

Figure 8:
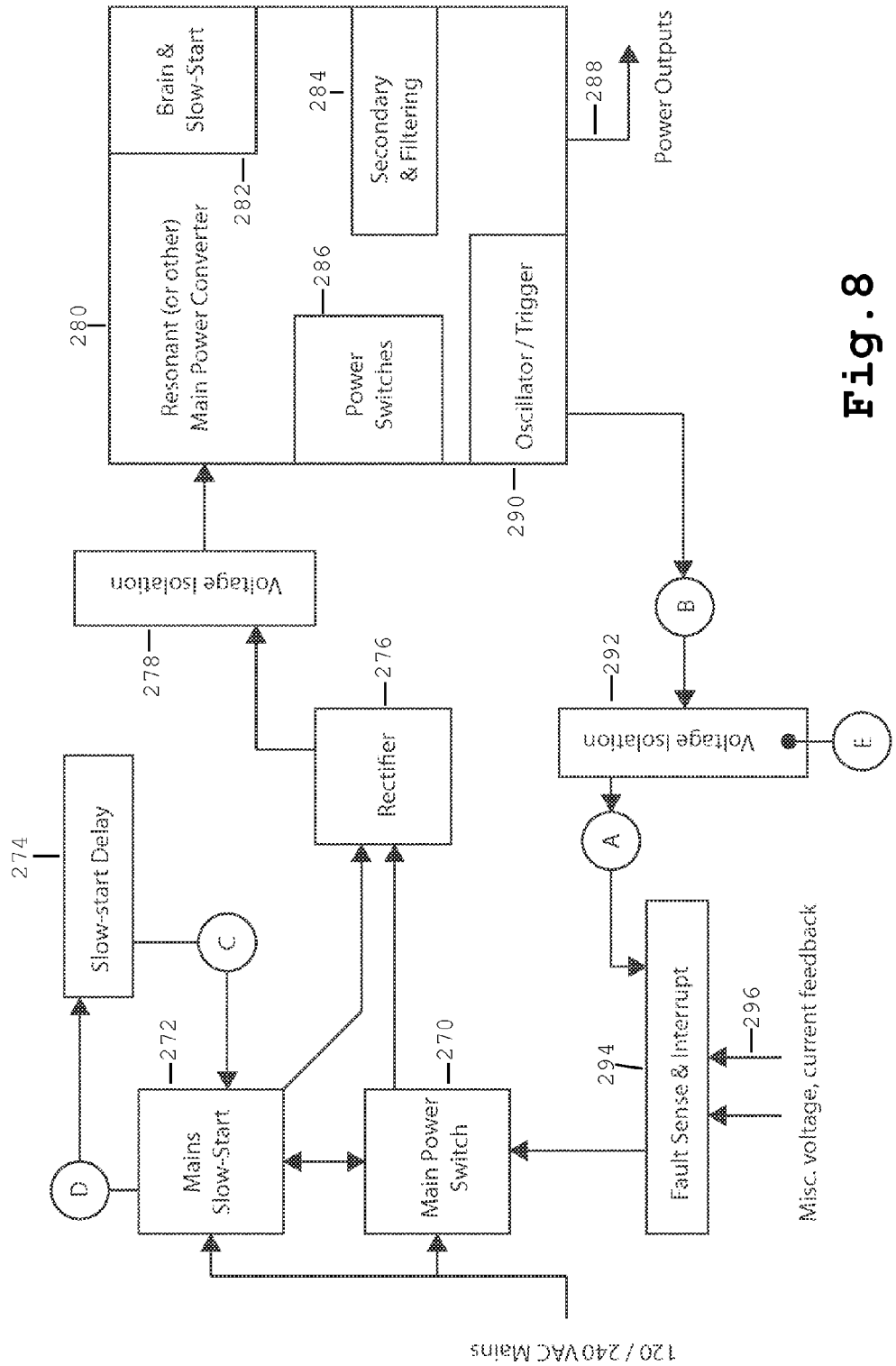
FIG. 8 schematically shows a main power supply.

FIG. 8 schematically shows a main power supply. Power mains supply main power switch 270, and slow-start mains 272, supply slow-start delay to control the main power switch 270. Both supply power to rectifier 276 and to voltage isolator 278. The resonant or other main power converter 280 includes a brain and slow-start sensor 282, secondary filtering 284 and power switches 286 to power outputs 288. Oscillator trigger 290 is connected through voltage isolation 292 to fault sense and interrupt controller 294, which also has inputs from miscellaneous sources and voltage and current feedback to interrupt the main power switch if necessary. (A) can be directly driven by (B), or (B) can supply (C) or (D) to (A). Fault sense & interrupt, which can be part of voltage isolation (E), shuts everything down upon secondary fault.

Figure 9:
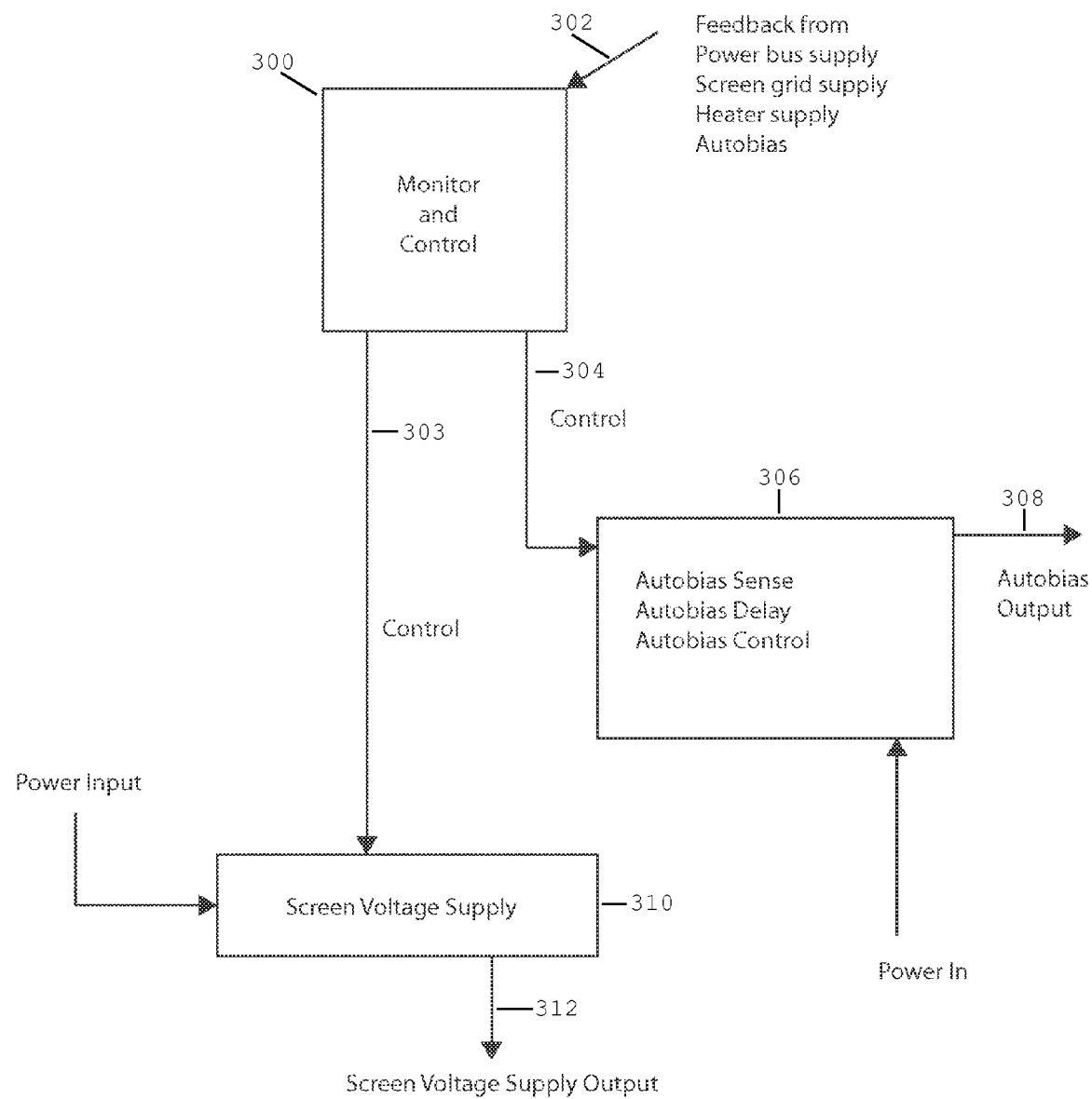
FIG. 9 schematically shows auto bias control.

FIG. 9 schematically shows auto bias control. Feedback 302 from power bus to supply screen grid supply heater supply autobias is connected to monitor and control 300. Monitor and control 300 controls 303, 304 autobias sense autobias delay autobias control 306 and autobias output 308, as well as screen voltage supply 310 and screen voltage supply output 312.

Figure 10:
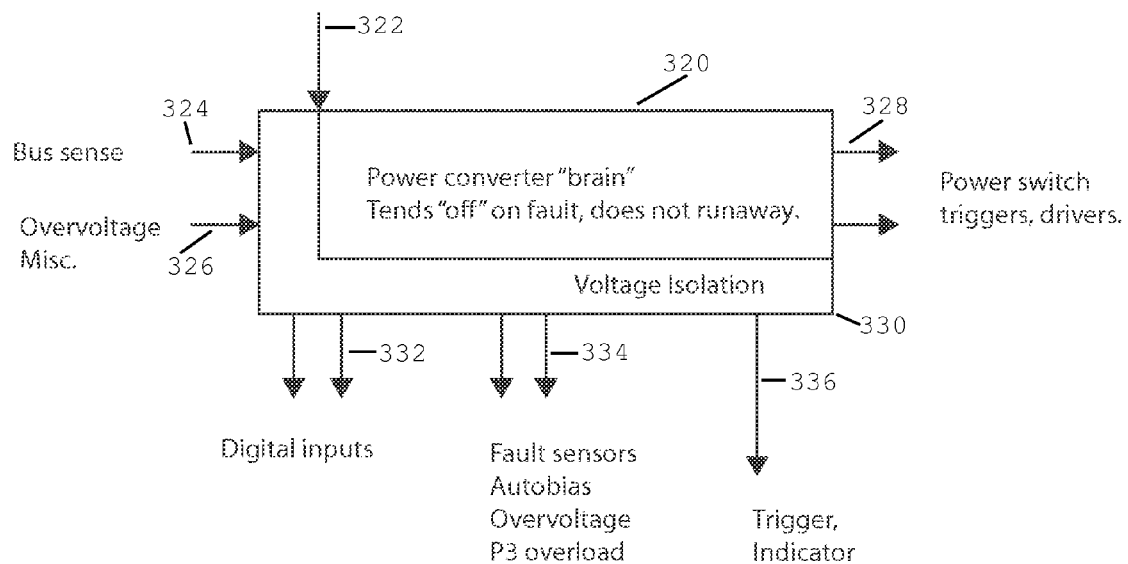
FIG. 10 schematically shows the power converter brain.

FIG. 10 schematically shows the power converter brain. The brain 320 can be slow-started with a simple current ramp 322. Magnetic control allows fast feedback from multiple sensors, such as bus sense 324 and overvoltage and miscellaneous sensors 326 without interaction, isolation or translation required. The brain-power converter 320 turns off on fault but does not run away and provides power to power switch triggers, drivers 328 and through voltage isolation 330 to digital inputs 332, fault sensors, autobias, overvoltage and P3 overload 334 and triggers and indicators 336.

Figure 11:
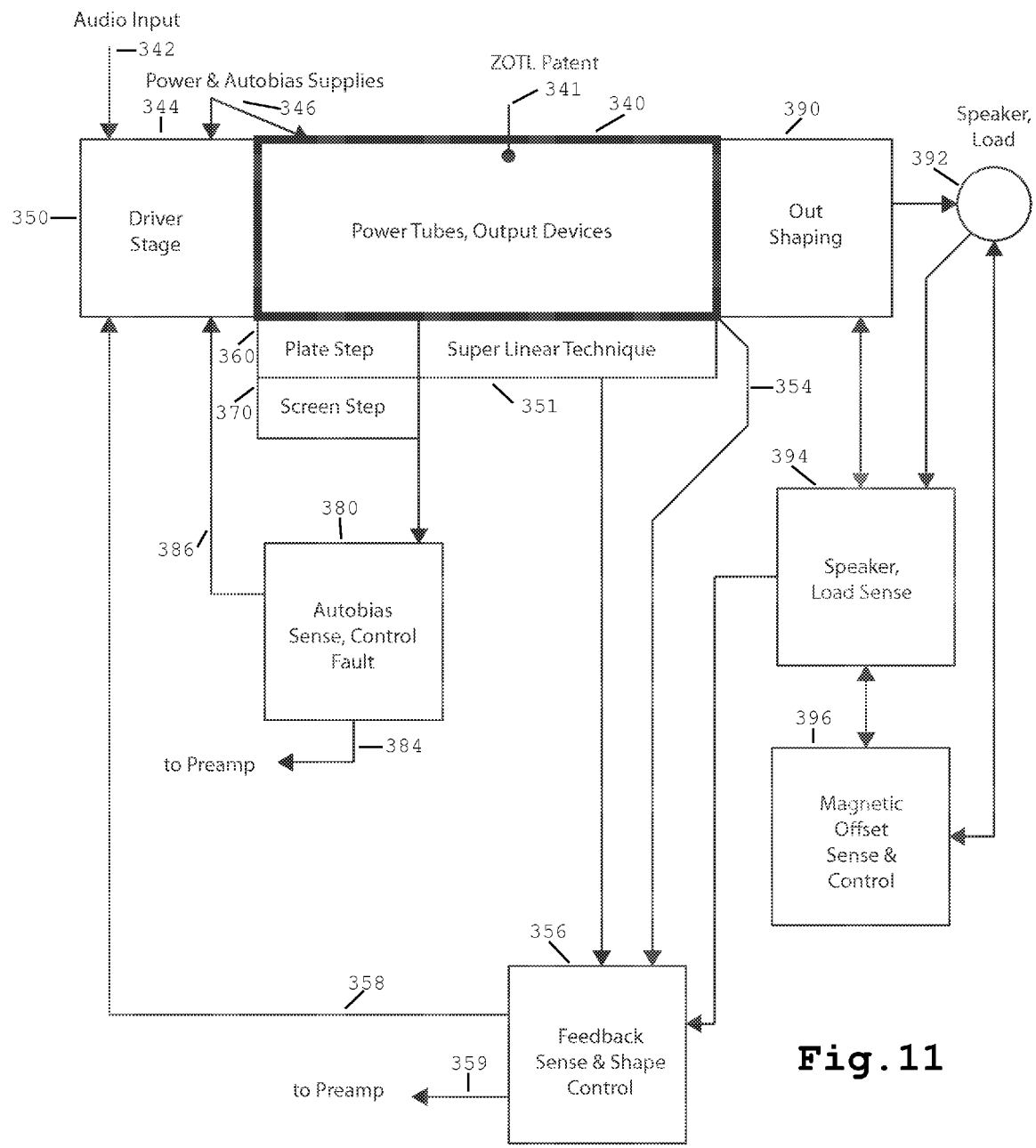
FIG. 11 schematically shows power tubes and output to speakers.

FIG. 11 schematically shows power tubes and output to speakers. Power tubes and output devices 340 are controlled by ZOTL inputs 341. A driver stage 350 has an audio input 342 and power 344 and autobias supplies 346. Plate-step 360, screen step 370 and super linear technique 351 control the power tubes and output devices 340. Output shaping 390 supplies the speaker load 392. Speaker load sensor 394 senses the speaker load, communicates with the output shaping controls 390 and provides feedback. Magnetic offset sensor and control 396 receives offset information from the speaker 392 and controls the magnetic offset of the speaker. Feedback sensor and shape control 356 receives feedback from the super linear control 351 from line 354 connected to the power tubes and output devices 340 and output shaping 390 and from the speaker load sensor 394. The feedback sensor and shape control provides feedback 358, 359 to the driver stage 350 and to the preamplifiers and its tubes.

Figure 12:
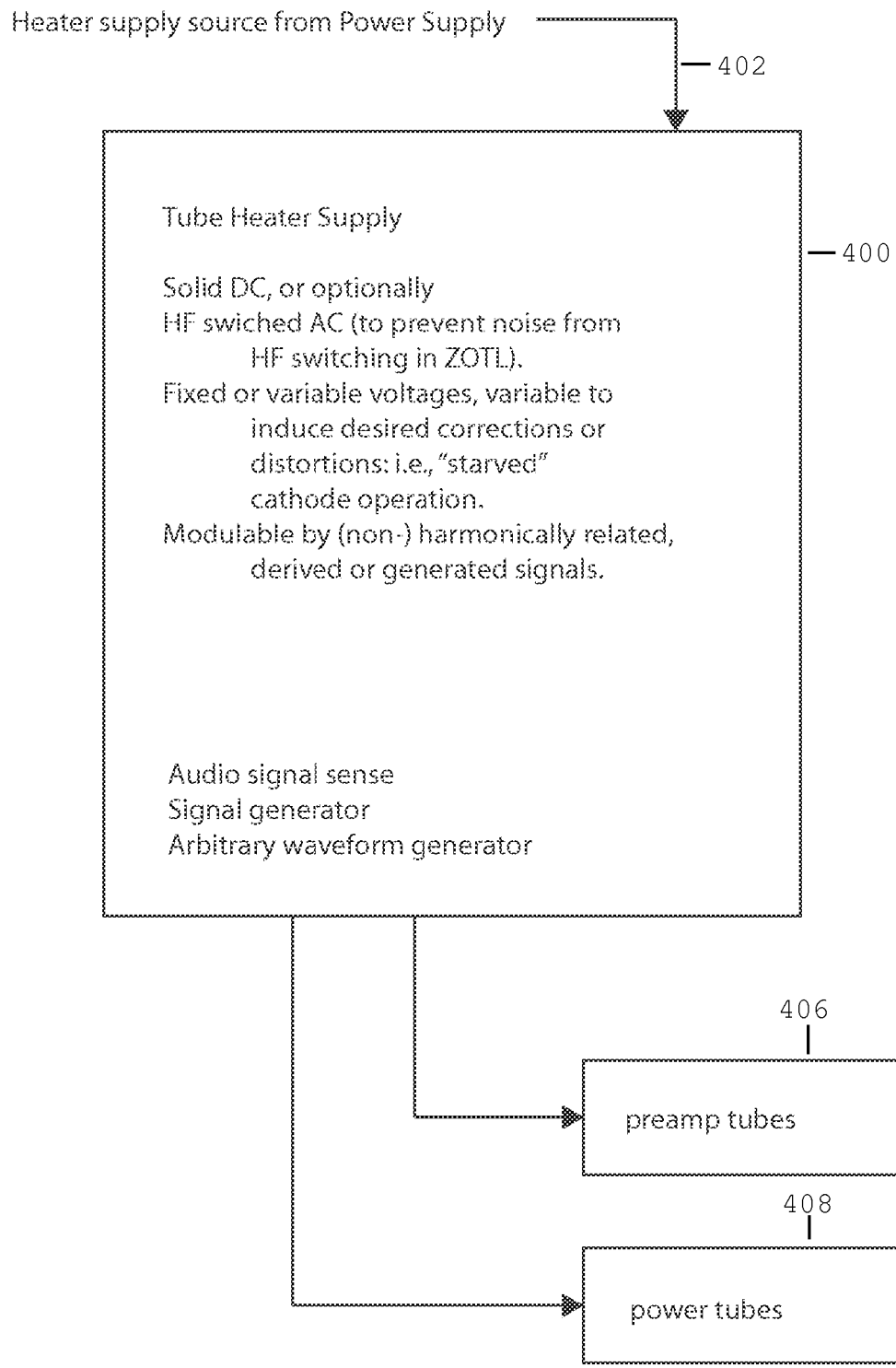
FIG. 12 schematically shows heater supply to preamplifier and power tubes.

FIG. 12 schematically shows heater supply to preamplifier audio input tubes and power output tubes. Tube heater supply 400 receives a heater supply source from power supply 402 and has a solid DC, or optionally high frequency (HF) switches AC (to prevent noise from HF switching in ZOTL), fixed or variable voltages, variable to induce desired corrections or distortions, i.e. starved cathode operation, and is modulable by (non-) harmonically related, derived or generated signals. Audio signal sense from a signal generator or arbitrary waveform generator is supplied to preamp audio input tubes 406 and power output tubes 408.

FIG. 13 schematically shows vacuum tube controls. FIG. 13 shows a pentode 410 with a cathode 412, heater 413, plate 414, screen 415, suppressor 416 and control grid 417. Screen grid 415 in a pentode, tetrode or triode is traditionally a mostly overlooked and underutilized but extremely potent and highly useful node for sensing tube operation and injecting corrective or disruptive signals through screen network 418. Various passive and active components may be used in the screen network, possibly involving other analog and/or digital control mechanisms for monitoring and adjusting signals to be multiplicatively combined inside the power tubes. Voltages applied to screen grid 415 may be modulated for desired effect, using the tube to multiplicatively mix in various corrective or disruptive feedback signals 419.

FIG. 14 schematically shows screen grid controls. Network active devices (FET, etc.) may also be switched or set to various impedances 420, 430 depending on idle, music content, signals from power supplies, feedback, etc. Where not internally connected to a cathode, the suppressor may be driven separately.

Figure 15:
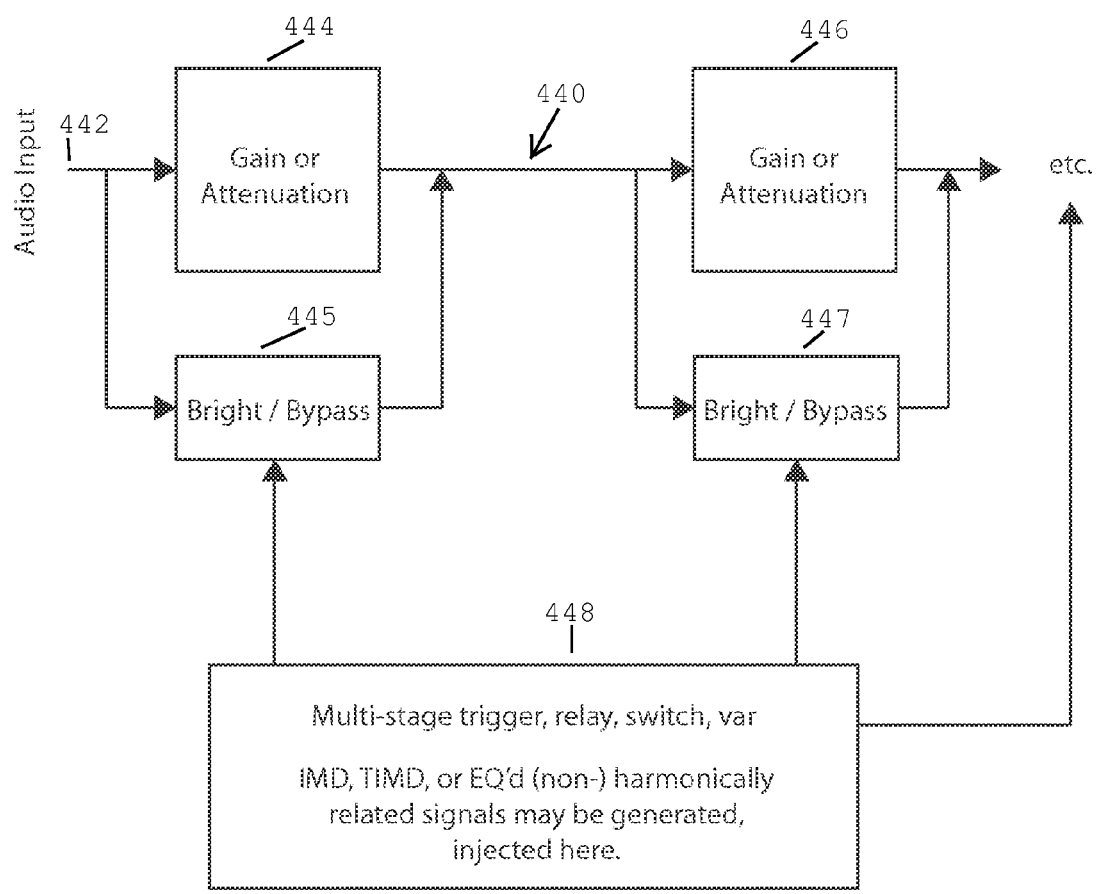
FIG. 15 schematically shows audio inputs.

FIG. 15 schematically shows audio input controls 440. Audio input 442 is supplied to gain or attenuation controls 444, 446, each having a bright/bypass 445,447 controlled by multi-stage trigger, relay or switch 448. IMD, TIMD, or EQ'd (non-) harmonically related signals may be generated, injected here.

Figure 16:
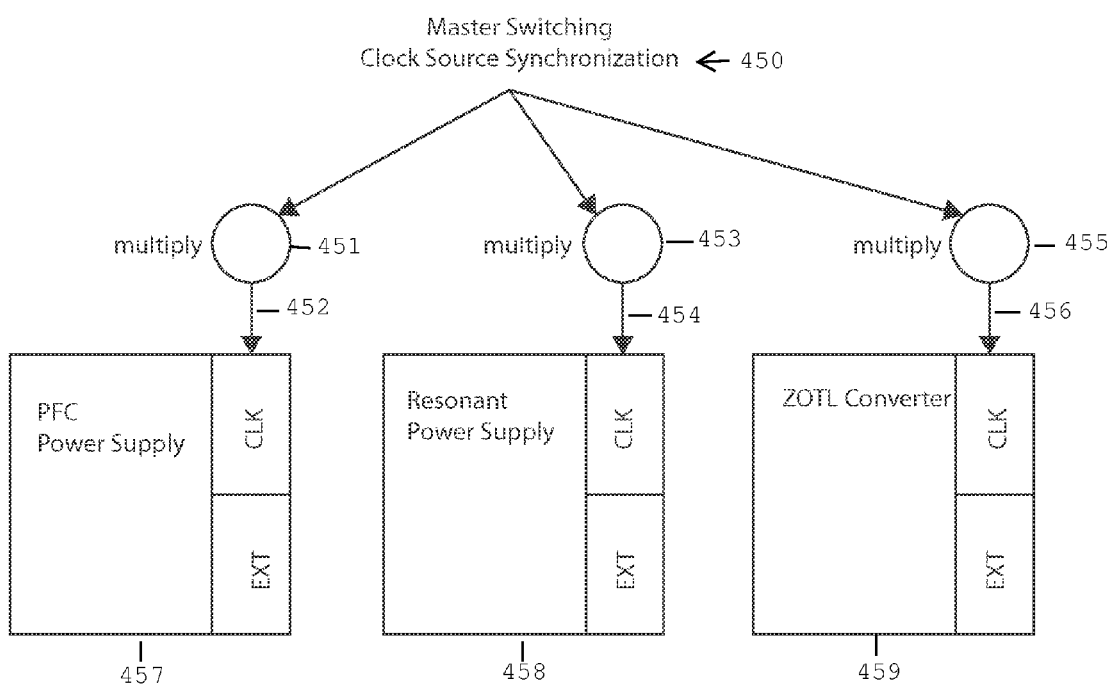
FIG. 16 schematically shows clock synchronization.

FIG. 16 schematically shows clock synchronization. Master switching clock source synchronization 450 supplies signals to multipliers 451, 453, 455 which provide clock and synchronization signals 452, 454, 456, coordinating the PFC power supply 457, resonant power supply 458 and ZOTL converter 459. Optionally the clock source may be picked out from noise on the audio signal.

Figure 17:
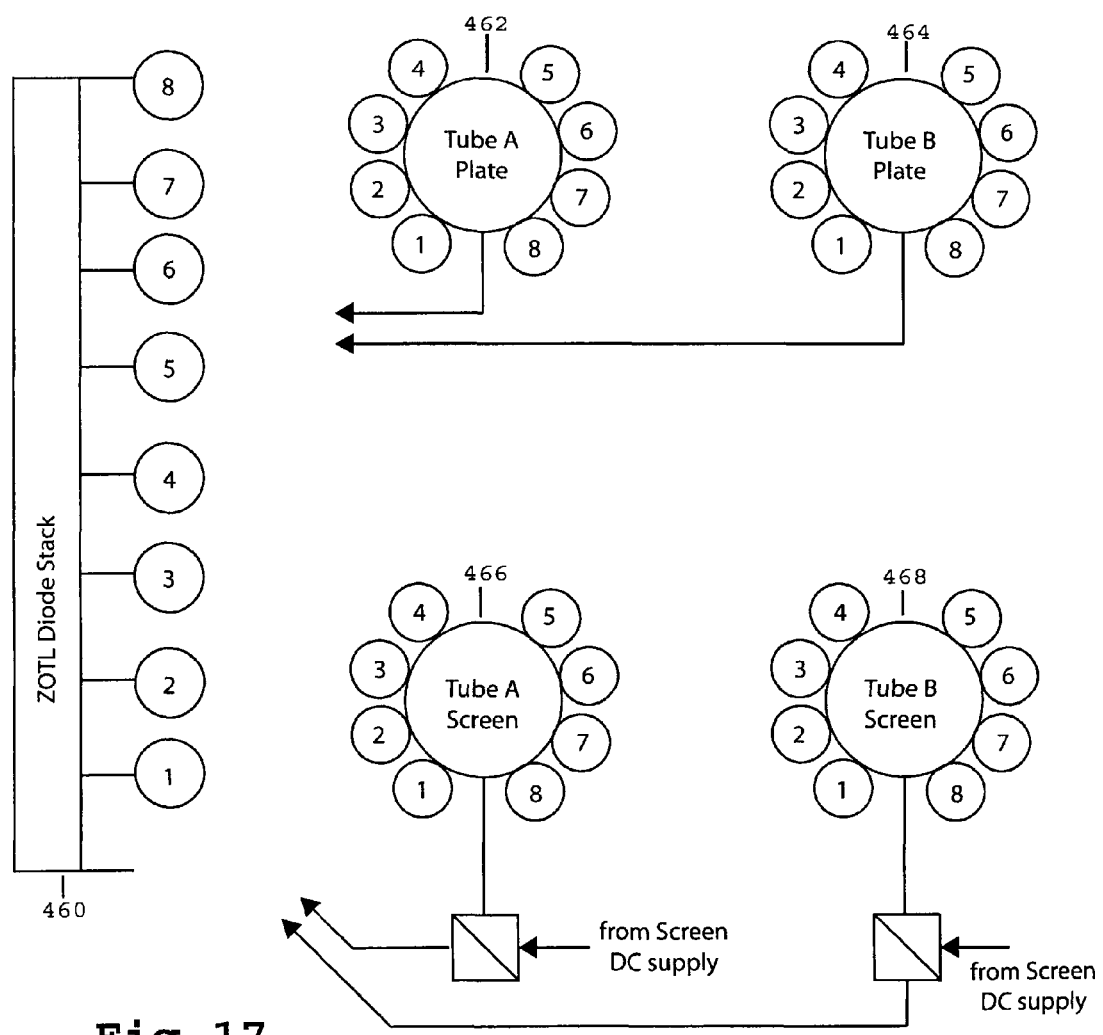
FIG. 17 schematically shows 20TL diode stack tube plate and screen controls.

FIG. 17 schematically shows ZOTL diode stack power output tube plate and screen controls. ZOTL diode stack 460 provides eight selectable outputs, 1-8, which may be individually applied to tube A plate 462 and tube B plate 464, and to tube A screen 466 and tube B screen 468. Plate-Step 360 shown in FIG. 11 allows each power output tube's plate to be independently connected to the high-voltage ZOTL diode stack, defining that tube's contribution to the overall power, tone and transfer characteristics. Power-Step or ScreenStep 370 seen in FIG. 11 allows each power tube's screen grid to be independently connected to the high-voltage ZOTL diode stack, to a screen DC supply, or to some other signal or power source (either altogether, or in some ratio) that is designed to inject desired corrective or disruptive action. Extending the ultra linear technique, this is the super linear technique that applies to ZOTL technology.

Figure 18:
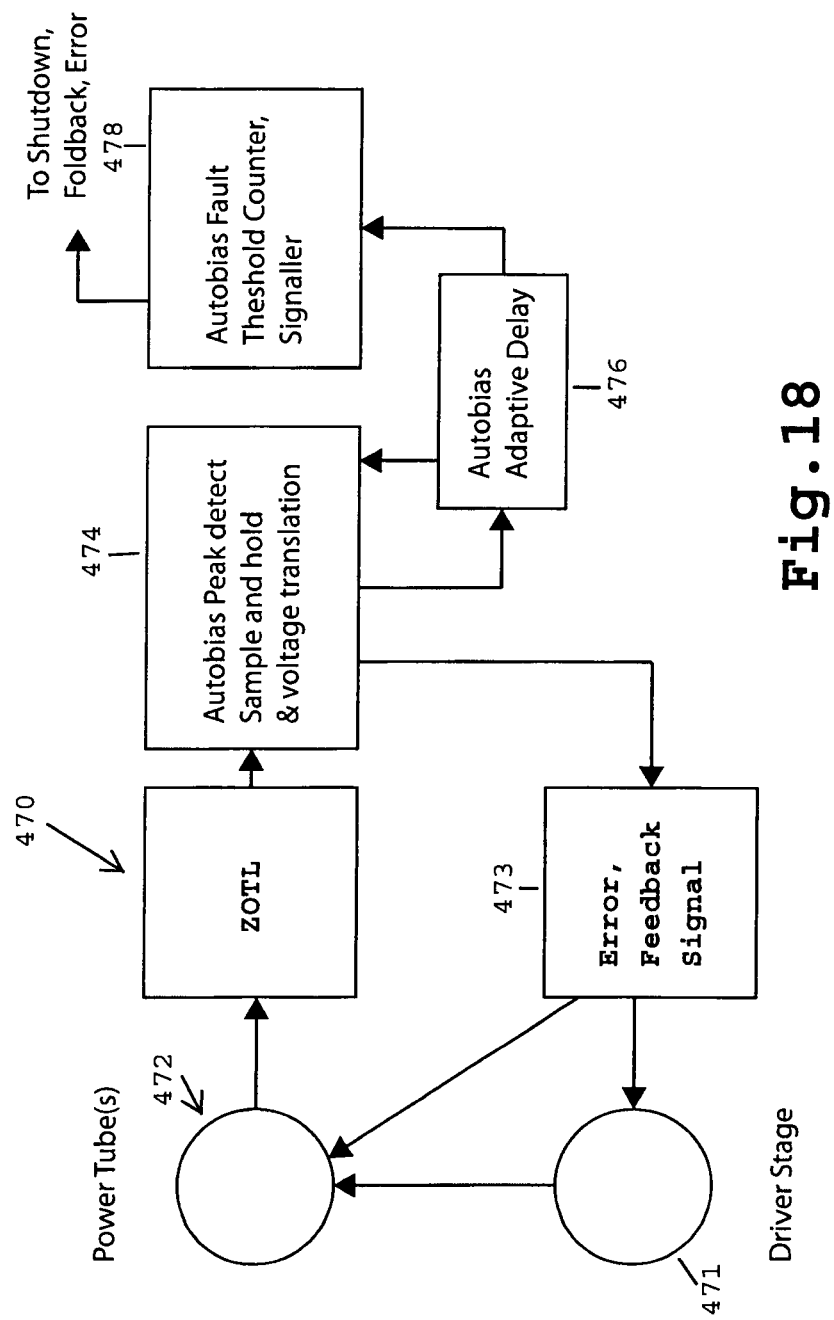
FIG. 18 schematically shows autobias tube controls.

FIG. 18 schematically shows autobias tube controls. Active, adaptive autobias 470 with autobias peak detection sample and hold and voltage translation 474, autobias adaptive tolerance delay 476, threshold counter and fault signaler 478 allows power tubes 472 and driver stage 471 to be changed and controlled 473 at any time, including during operation. An inability to achieve proper bias (user definable) existing too long, or existing too many times in a defined period, results in an error signal being passed to upstream power source, for shutdown, foldback and indication. The detection, delay, signaling and control voltage applications may be made with analog and/or digital circuitry, particularly but not necessarily a microprocessor used to count bias upset over relatively long time periods. Tube aging and performance metrics may also be collected, computed and applied this way—weak tubes may be suppressed, with an indicator lamp turning on when they require service.

Figure 19:
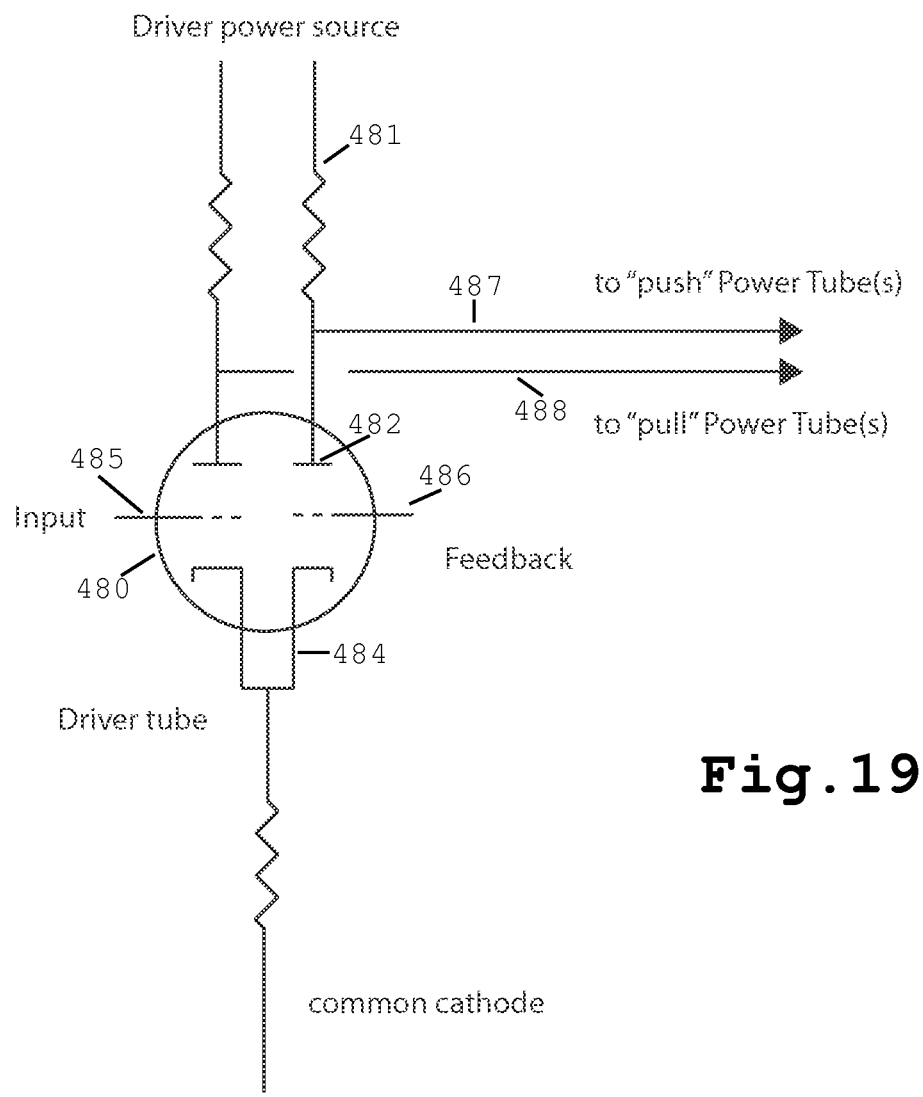
FIG. 19 schematically shows feed to push and pull power tubes.

FIG. 19 schematically shows feed to push and pull power tubes. Driver tube 480 has a power source 481 connected to plates 482. The autobias circuit may adjust the common cathode 484 current in driver tube 480 to control overall operating point, and it may also adjust the differential inputs 485, 486 to control "push" 487 and/or "pull" 488 operating points.

Figure 20:
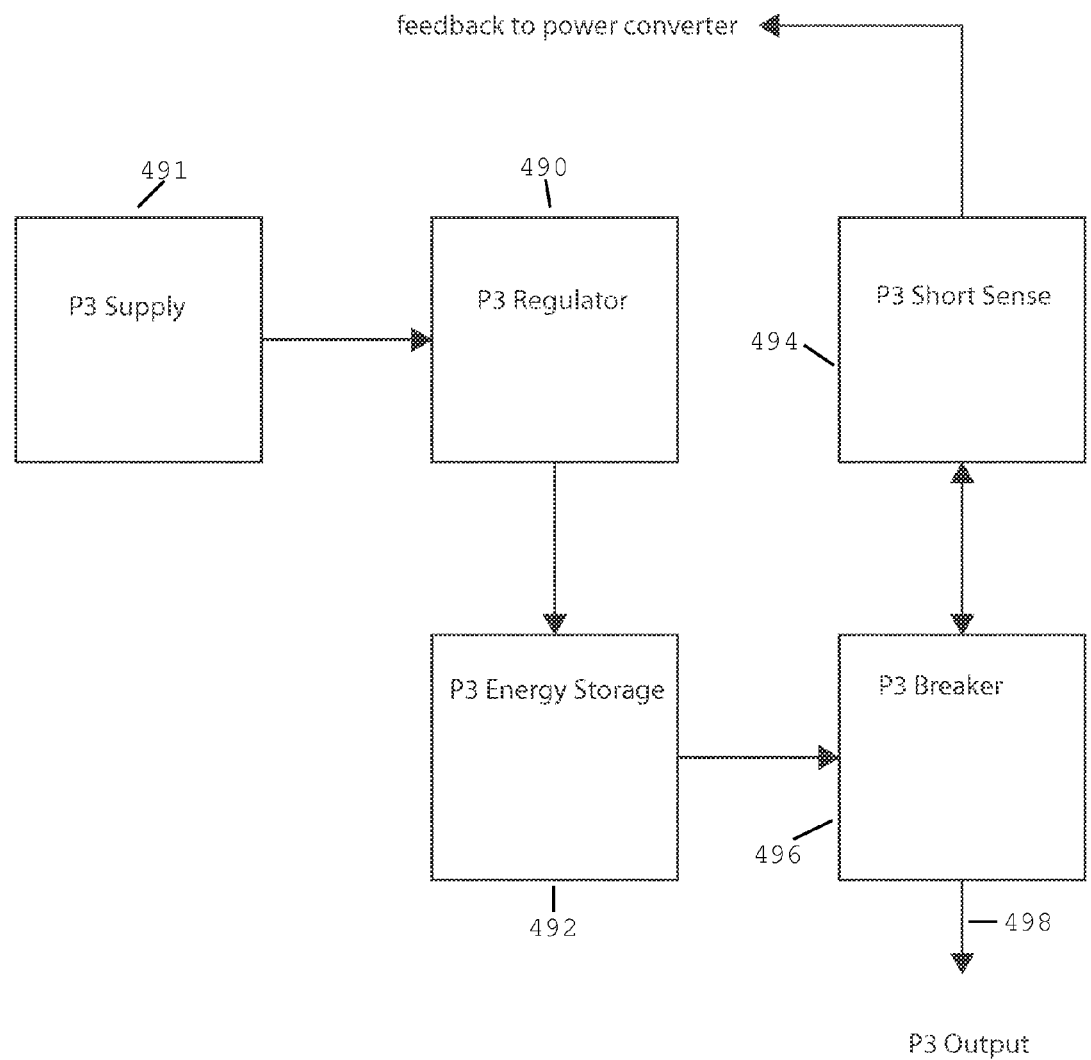
FIG. 20 schematically shows pickups and pedal breakers.

FIG. 20 schematically shows pickups and pedal breakers. P3 regulator 490 is powered from P3 power supply 491 and supplies P3 post-energy-storage 492 to circuit breaker 496 to P3 output 498 to protect sensitive pickups, pedals, electronics from high-energy discharge upon fault. P3 short sensor 494 provides feedback to the power converter.

These and further and other objects and features of the invention are apparent in the disclosure, which includes the above and ongoing written specification, with the claims and the drawings.

While TNA has been described with reference to specific embodiments, modifications and variations of TNA may be constructed without departing from the scope of TNA.

While the invention has been described with reference to specific embodiments, modifications and variations of the invention may be constructed without departing from the scope of the invention, which is defined in the following claims.

We claim:

1. Apparatus comprising:
   a vacuum tube amplifier having
   audio input,
   audio input preamplifier tubes connected to the audio input,
   audio power output amplifier tubes connected to the audio input tubes,
   and solid state controllers connected to the audio input, the audio input preamplifier tubes and the audio power output amplifier tubes,
   a mains power connector,
   a multistage power filter connected to the mains power connector and adapted for blocking ingress and egress noise through mains power connector,
   metal shielding adapted for blocking inductively-coupled ingress and egress noise,
   and a power supply connected to the multistage power filter.

2. The apparatus of claim 1, wherein the power supply is adapted to improve power factor.

3. The apparatus of claim 1, wherein the power supply is adapted to increase voltage.

4. The apparatus of claim 1, further comprising a resonant converter connected to the power supply and adapted to convert voltage from the power supply to multiple voltage levels.

5. The apparatus of claim 4, wherein the resonant converter operates in quasi-resonant mode.

6. The apparatus of claim 4, further comprising power switches in the resonant converter and a resonant converter brain controller connected to the resonant converter, subsequently connected to the power switches, and also connected to sensors and adapted for monitoring and controlling the power switches.

7. The apparatus of claim 6, further comprising secondary rectifiers connected to the resonant converter and adapted for providing multiple rectified DC voltages for supplying power to the audio input preamplifier tubes, the audio power output amplifier tubes, and the solid state controllers.

8. The apparatus of claim 4, further comprising a secondary rectifier connected to the resonant converter and adapted for providing multiple rectified DC voltages for supplying DC power to the audio input preamplifier tubes, the audio power output amplifier tubes, and the solid state controllers.

9. The apparatus of claim 8, wherein the solid state controllers further comprise a screen step controller having multiple voltage outputs for connecting to screen grids of the power output tubes.

10. The apparatus of claim 8, wherein the solid state controllers further comprise a plate-step controller having multiple voltage outputs for connecting to plates of the power output tubes.

11. The apparatus of claim 8, wherein the solid state controllers further comprise an autobias controller having multiple voltage outputs adapted for controlling the power output tubes.

12. The application of claim 8, further comprising a ZOTL converter connected to the secondary rectifier for supplying power to the ZOTL converter, connected to the power output tubes and connected to a signal output, and adapted for converting high-voltage low-current in the power output tubes to lower-voltage higher-current in the signal output.

13. The apparatus of claim 12, further comprising a feedback connection between the ZOTL and the power output tubes and adapted for biasing the power output tubes.

14. The apparatus of claim 12, further comprising a feedback connection between the ZOTL and the audio input tubes and adapted for biasing the power output tubes.

15. The apparatus of claim 13, further comprising monitor and safety networks connected to the resonant converter brain and to the ZOTL converter, the autobias, the audio power amplifier output tubes, the audio input preamplifier tubes, the audio input tubes power supply, the secondary rectifiers, the mains power input, and adapted to cause the resonant converter brain to reduce power output of the power supply or to cut off the power supply.

16. The apparatus of claim 15 further comprising external device supply for supplying power to external devices or external effects pedals and active pickups the external device supply connected to audio input and to the monitor and safety network for redirecting or eliminating power to the external device supply.

17. Apparatus comprising:
a vacuum tube amplifier having
audio input,
audio input preamplifier tubes connected to the audio input,
audio power output amplifier tubes connected to the audio input tubes,
and solid state controllers connected to the audio input, the audio input preamplifier tubes and the audio power output amplifier tubes, a resonant converter connected to the power supply and adapted to convert voltage from the power supply to multiple voltage levels, wherein the resonant converter further comprises inputs of multiple system voltages, tube voltages, and DC heater voltage, and regulates one or more of these inputs to provide constant heater voltage to the audio input tubes.

18. The apparatus of claim 17 further comprising a sample and compare network connected to the audio input and to the audio input preamplifier tubes and to the resonant converter, the resonant converter brain and the secondary rectifier, and adapted for adjusting voltages supplied to the amplifier circuitry.

19. The apparatus of claim 17 further comprising multiple ground planes used for shielding without necessarily providing return current conduction paths and having isolating impedance voids and metal fences to reduce conducted noise emissions and block electrostatic interference.

20. Apparatus comprising:
a vacuum tube amplifier having
audio input,
audio input preamplifier tubes connected to the audio input,
audio power output amplifier tubes connected to the audio input tubes,
and solid state controllers connected to the audio input, the audio input preamplifier tubes and the audio power output amplifier tubes, a resonant converter connected to the power supply and adapted to convert voltage from the power supply to multiple voltage levels, wherein the resonant converter and resonant converter brain are combined and have load voltage and current sensors, other sensor inputs, fault and performance inputs, and line voltage sensor input, a fault monitor and signal connected to the fault input, and autobias and output short detectors, and factory adjusted inputs connected to the fault monitor and signaler.

21. The apparatus of claim 20 further compromising a secondary high-frequency noise optical controller having power outputs to high voltage power busses, heater plates and screen voltage outputs a PFC primary connected to a live voltage source, a voltage isolation connected to the PFC primary a PFC secondary connected to the voltage isolation and the resonant converter and brain and to the high-frequency noise ISO optical controller.

22. The apparatus of claim 17 further comprising a main slow-start delay connected to the power supply for supply prestart ramp up the power.

23. The apparatus of claim 17 further comprising a drive stage connected to the audio input preamplifier tubes, audio power output amplifier tubes connected to the drive stage a ZTOL converter connected to the audio power output amplifier tubes, output shaping networks connected to the ZTOL converter signal output connected to the output shaping networks.

24. The apparatus of claim 23 further comprising a speaker load sensor connected to the signal output a magnetic offset sense and control connected to the speaker load sensor and to the signal output a feedback sensor and controller connected to the speaker load sensor, to the ZOTL and output shaping and having an output connected to the driver stage.

* * * * *